United States Patent
Kusumoto et al.

(10) Patent No.: US 7,473,929 B2
(45) Date of Patent: Jan. 6, 2009

(54) SEMICONDUCTOR DEVICE AND METHOD FOR FABRICATING THE SAME

(75) Inventors: Osamu Kusumoto, Nara (JP); Makoto Kitabatake, Nara (JP); Masao Uchida, Osaka (JP); Kunimasa Takahashi, Osaka (JP); Kenya Yamashita, Osaka (JP); Masahiro Hagio, Shiga (JP); Kazuyuki Sawada, Osaka (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 10/880,550

(22) Filed: Jul. 1, 2004

(65) Prior Publication Data

US 2005/0001217 A1    Jan. 6, 2005

(30) Foreign Application Priority Data

Jul. 2, 2003    (JP)    ............... 2003-189980

(51) Int. Cl.
*H01L 29/15* (2006.01)
*H01L 31/0312* (2006.01)

(52) U.S. Cl. .................... 257/77; 257/288; 257/289; 257/472; 257/618; 257/E29.026; 257/E29.027; 257/E29.104; 257/E29.106; 257/E29.254

(58) Field of Classification Search .............. None
See application file for complete search history.

(56) References Cited

U.S. PATENT DOCUMENTS

| | | | | |
|---|---|---|---|---|
| 5,753,938 | A | * | 5/1998 | Thapar et al. ............ 257/77 |
| 5,977,564 | A | * | 11/1999 | Kobayashi et al. ......... 257/77 |
| 6,580,125 | B2 | * | 6/2003 | Kitabatake et al. ........ 257/335 |
| 6,617,653 | B1 | * | 9/2003 | Yokogawa et al. ......... 257/379 |
| 2002/0139992 | A1 | * | 10/2002 | Kumar et al. ............ 257/134 |
| 2002/0158251 | A1 | * | 10/2002 | Takahashi et al. ........ 257/70 |
| 2003/0137010 | A1 | * | 7/2003 | Friedrichs et al. ........ 257/355 |

(Continued)

FOREIGN PATENT DOCUMENTS

JP    2001-144288    *    5/2001

(Continued)

OTHER PUBLICATIONS

O. Kusumoto et al., SiC Vertical DACFET (Vertical Delta-Doped Accumulation Channel MOSFET), Materials Science Forum, vol. 389-393, (2002), pp. 1211-1214.

(Continued)

*Primary Examiner*—Andy Huynh
*Assistant Examiner*—Hoang-Quan T Ho
(74) *Attorney, Agent, or Firm*—McDermott Will & Emery LLP

(57) ABSTRACT

Ion implantation is carried out to form a p-well region and a source region in parts of a high resistance SiC layer on a SiC substrate, and a carbon film is deposited over the substrate. With the carbon film deposited over the substrate, annealing for activating the implanted dopant ions is performed, and then the carbon film is removed. Thus, a smooth surface having hardly any surface roughness caused by the annealing is obtained. Furthermore, if a channel layer is epitaxially grown, the surface roughness of the channel layer is smaller than that of the underlying layer. Since the channel layer having a smooth surface is provided, it is possible to obtain a MISFET with a high current drive capability.

13 Claims, 18 Drawing Sheets

U.S. PATENT DOCUMENTS

2004/0051104 A1\* 3/2004 Yamashita et al. ............ 257/77
2005/0173739 A1\* 8/2005 Kusumoto et al. .......... 257/263

FOREIGN PATENT DOCUMENTS

| JP | 2001-144288 A | | 5/2001 |
|---|---|---|---|
| WO | WO 00/16382 | | 3/2000 |
| WO | WO 03/028110 | \* | 4/2003 |
| WO | WO/2004/008512 | \* | 1/2004 |

OTHER PUBLICATIONS

A. Ohi et al., "Post-Implantation Annealing Effects on the Surface Morphology and Electrical Characteristics of 6H-SiC Implanted with Aluminum", Materials Science Forum, vol. 389-393, (2002), pp. 831-834.

"Schotty and Ohmic Contacts to SiC", Process Technology for Silicon Carbide Devices, p. 120, The Institute of Electrical Engineering.

Roccaforte, et al., "Ohmic Contacts to SiC", International Journal of High Speed Electronics and Systems, 2005, pp. 781-786.

\* cited by examiner

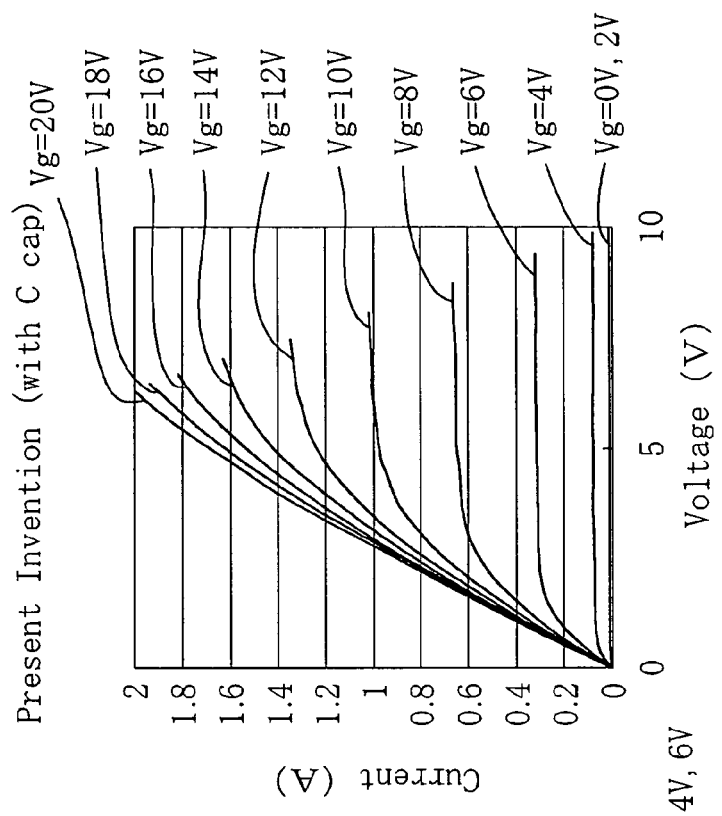
FIG. 11A Reference Example (with C cap)
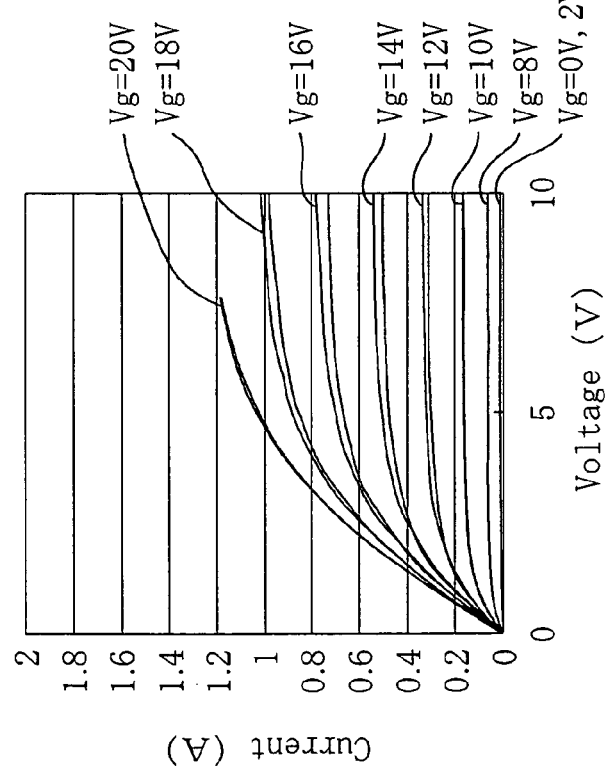
FIG. 11B Present Invention (with C cap)

SEMICONDUCTOR DEVICE AND METHOD FOR FABRICATING THE SAME

BACKGROUND OF THE INVENTION

The present invention relates to a power device that utilizes a silicon carbide substrate (SiC substrate) used to handle high voltages and high currents.

Conventionally, a power device has been desired to be low-loss since it is a semiconductor device that handles high voltages and high currents. In the prior art, a power device that uses a silicon (Si) substrate has been the prevailing device. However, in recent years, a power device that uses a SiC (silicon carbide) substrate made of a semiconductor material containing Si and C in the ratio 1:1 is getting attention and being developed. Since the dielectric breakdown field of SiC is ten times greater than that of silicon, SiC makes it possible to maintain high reverse blocking voltage even if a depletion layer at a pn junction or a Schottky junction is thinned. Therefore, if a SiC substrate is used, the thickness of the resulting device can be reduced, and dopant concentration can be increased. Accordingly, a SiC substrate is highly expected as a substrate material for forming a power device that has a low on-state resistance, handles high voltages, and achieves low power loss. Herein, SiC substrates include a substrate which is made of a material different from SiC and on which a SiC crystal layer is epitaxially grown. Silicon carbide represented by "SiC" is a material whose physical and chemical properties are different from those of silicon that is represented by "Si:C" and contains a small amount (a few percent or less) of C.

However, the carrier mobility of a MISFET that uses a SiC substrate, in a channel region, is disadvantageously lower that that of a MISFET that uses a silicon substrate. This is because a thermal oxide film on a silicon substrate is made of pure silicon oxide, whereas carbon remains in a thermal oxide film on a SiC substrate, and the interface state density at an interface between the thermal oxide film and a SiC layer (semiconductor layer) is high.

Therefore, in order to overcome this disadvantage, an accumulation-mode MISFET is recently proposed as a MISFET that uses a SiC substrate, instead of a normal inversion-mode MISFET. For example, as such an accumulation-mode MISFET that uses a SiC substrate, Document 1 (Japanese Unexamined Patent Publication No. 2001-144288 (pp. 3-7, FIGS. 5 through 10)) discloses a double-implantation MISFET in which a channel layer at a surface region is epitaxially grown.

FIG. 14 is a cross-sectional view illustrating the structure of a conventional accumulation-mode MISFET that uses a SiC substrate, i.e., a conventional double-implantation MISFET.

As shown in FIG. 14, the double-implantation MISFET includes: a SiC substrate 131; a high resistance SiC layer 132 provided on the SiC substrate 131; a p-well region 133 formed by implanting p-type dopant ions into a part of a surface region of the high resistance SiC layer 132; a channel layer 135 formed on upper surfaces of the p-well region 133 and the high resistance SiC layer 132 and containing n-type dopant; a source region 136 formed by implanting n-type dopant ions into parts of the channel layer 135 and the p-well region 133; a gate insulating film 137 formed of a thermal oxide film provided on a surface of the channel layer 135; a gate electrode 110 provided on the gate insulating film 137; a source electrode 138 that is provided on a wall surface of a groove passing through the source region 136 to reach the p-well region 133, and that is formed so as to be in contact with the p-well region 133 and the source region 136; and a drain electrode 139 formed so as to be in ohmic contact with the backside of the SiC substrate 131.

The source region 136 and the high resistance SiC layer 132, each being an n-type semiconductor layer, are electrically connected with each other via the channel layer 135 that is also an n-type semiconductor layer. Furthermore, a portion of the channel layer 135 located in an upper part of the source region 136 is partially removed. The source electrode 138, the source region 136 and the p-well region 133 are annealed so that they are in ohmic contact with each other. The SiC substrate 131 and the drain electrode 139 are in ohmic contact with each other.

FIGS. 15A through 15E and FIGS. 16A through 16E are cross-sectional views illustrating process steps for fabricating a conventional double-implantation MISFET.

First, in the step shown in FIG. 15A, on a low resistance SiC substrate 131, a high resistance SiC layer 132 whose resistance is higher than that of the SiC substrate 131 (and whose dopant concentration is low) is epitaxially grown.

Next, in the step shown in FIG. 15B, p-type dopant ions are selectively implanted into a part of a surface region of the high resistance SiC layer 132, thereby forming a p-well region 133.

Then, in the step shown in FIG. 15C, annealing for activating the dopants that have been implanted thus far is performed. At this time, a surface of the p-well region 133 becomes rough.

Subsequently, in the step shown in FIG. 15D, a channel layer 135 containing an n-type dopant is epitaxially grown on the surfaces of the p-well region 133 and the high resistance SiC layer 132.

Thereafter, in the step shown in FIG. 15E, high concentration n-type dopant ions are implanted into parts of the channel layer 135 and the p-well region 133, thus forming a source region 136 that passes through the channel layer 135 to reach an inner portion of the p-well region 133. In this case, the source region 136 and the high resistance SiC layer 132, each being an n-type semiconductor layer, are electrically connected via the channel layer 135 that is also an n-type semiconductor layer.

Next, in the step shown in FIG. 16A, annealing for activating the dopant implanted into the source region 136 is performed. At this time, surfaces of the channel layer 135 and the source region 136 become rough.

Then, in the step shown in FIG. 16B, a groove 134 that passes through the source region 136 to reach an upper portion of the p-well region 133 is formed, and then exposed surfaces of the channel layer 135, the source region 136 and the p-well region 133 are thermally oxidized, thus providing a gate insulating film 137 formed of a thermal oxide film.

Subsequently, in the step shown in 16C, portions of the gate insulating film 137 located on a wall surface of the groove 134 and around the groove 134 are removed.

Thereafter, in the step shown in FIG. 16D, a source electrode 138 is formed on an exposed portion of the source region 136 from which the gate insulating film 137 has been removed. Further, a drain electrode 139 is formed on the backside of the SiC substrate 131.

Next, in the step shown in FIG. 16E, a gate electrode 110 is formed on the gate insulating film 137. Furthermore, annealing is performed so that the source electrode 138, the source region 136 and the p-well region 133 are in ohmic contact with each other, and the SiC substrate 131 and the drain electrode 139 are in ohmic contact with each other.

In the conventional MISFET that uses the SiC substrate, the channel layer 135, the source region 136 and the high resistance SiC layer 132 are each formed by an n-type semiconductor layer; therefore, this MISFET is not an inversion-mode MISFET (i.e., a typical MISFET) that utilizes inversion of the channel layer, but an accumulation-mode MISFET that utilizes an accumulation state of the channel layer. In an accumulation-mode MISFET having such a channel layer, as compared with an inversion-mode MISFET, electric current flows to a deep region separated from an MIS interface; therefore, the accumulation-mode MISFET is unlikely to be influenced by a region in the vicinity of the MIS interface where interface state density is high, and thus channel mobility (carrier mobility) is improved.

Normally, as a SiC substrate used for such a semiconductor device, an off substrate whose principal surface is deviated and inclined from a nominal crystal plane (e.g., a (0001) plane) is used. This is because if such an off substrate is used, the high resistance SiC layer 132 is subjected to step flow growth when it is epitaxially grown, and thus the crystallinity of the high resistance SiC layer 132 is improved.

SUMMARY OF THE INVENTION

However, according to Document 1, with the use of such an off substrate, if a channel layer of a MISFET is provided to be in parallel with the principal surface of the substrate, the carrier mobility in the channel layer is decreased, and if the channel layer is provided to be perpendicular to the principal surface in an off direction, the carrier mobility in the channel layer is improved. This is because a step exists at a surface of the off substrate, and it becomes difficult for electric current to flow if a channel is set in a direction traversing this step. In other words, the mobility is decreased due to the irregularities of the surface.

Moreover, it is known that the irregularities of the surface of a SiC layer are further aggravated by annealing for high-temperature activation after ion implantation. Although activation temperature must be set at as high as 1700° C. or more in order to achieve sufficient activation, high carrier density and high carrier mobility, the higher the temperature, the more the surface roughness of the SiC layer is aggravated; in addition, the longer the annealing time, the more the surface roughness is aggravated. For example, an average surface roughness Ra prior to annealing is 1 nm or less; however, if activation annealing is performed at a temperature of 1700° C. for 30 minutes, the average surface roughness Ra becomes about 10 nm, which is ten times or more greater than that prior to the activation annealing (see, for example, Document 2 (Materials Science Forum Vols. 389-393, pp 831-834)). In this case, the step height of a macro step is as high as 50 nm or more, and thus a maximum surface roughness Rmax is 50 nm or more.

For example, due to activation annealing shown in FIG. 15C, which is performed after ion implantation to the well region 133, step bunching is caused or a hillock is formed at an exposed surface of the well region 133, thus aggravating its surface roughness. Then, in the step shown in FIG. 15D, the channel layer 135 is epitaxially grown on the surface of the well region 133 whose surface roughness is aggravated and whose smoothness is poor. Therefore, the surface roughness of the channel layer 135 is also aggravated, and thus the smoothness thereof is also poor. The channel layer 135 has an average surface roughness Ra of about 10 nm, and a maximum surface roughness Rmax of 50 nm or more. Furthermore, after the channel layer 135 has been deposited, ion implantation for the source region 136 is carried out in the step shown in FIG. 15E, and activation annealing is carried out in the step shown in FIG. 16A; therefore, the surface roughness of the channel layer 135 is further aggravated, and the smoothness thereof becomes poorer. Thus, the more the surface roughness is aggravated, the more the carrier mobility in the channel layer of the MISFET is reduced.

As a channel layer of such an accumulation-mode MISFET, the present inventors proposed a structure (stacked doped layer structure) in which an intentionally undoped first semiconductor layer, and a heavily doped and extremely thin second semiconductor layer (δ-doped layer) are alternately stacked, and we proved that a MISFET having the channel layer formed of such a stacked doped layer structure exhibits a considerably high carrier mobility (see Document 3 (Materials Science Forum Vols. 389-393, pp 1211-1214)). In this stacked doped layer structure, the second semiconductor layer (δ-doped layer) has to be extremely thinned such that the thickness thereof is about 10 nm, and thus the average surface roughness of the channel layer needs to be considerably reduced in accordance with the thickness of the second semiconductor layer. That is, the surface roughness of the channel layer has to be at least equal to or smaller than the thickness of the second semiconductor layer, and must be at least 10 nm or less. Moreover, in order to actually achieve a high functionality using a widegap semiconductor, the surface roughness of the channel layer is preferably 1 nm or less.

Herein, the average surface roughness Ra refers to a centerline average roughness, and is defined by the JIS Standard as follows.

The average surface roughness Ra is a value given by the following equation:

$$Ra = (1/L) \cdot \int (X=0 \sim L) \{|F(X)|dX\}$$

where a portion of a measured length L is extracted from a roughness curve in a centerline direction thereof, the X axis is taken in the centerline direction of the extracted portion, the Y axis is taken in the axial magnification direction (which is perpendicular to the X axis) of the extracted portion, and the roughness curve is represented by Y=F(X).

Besides, the present inventors found that if a large step such as step bunching exists at a surface of a channel layer, a thermal oxide film serving as a gate insulating film of a MISFET is thinned at the step portion, and the dielectric voltage of the oxide film is reduced in this portion.

FIG. 17 is an SEM photograph showing the structure of an accumulation-mode double-implantation MISFET in the vicinity of its channel layer. The structure of this MISFET is substantially similar to that of the MISFET disclosed in Non-patent Document 2.

In FIG. 17, three undoped layers each not subjected to intentional doping and having a thickness of 40 nm, and three doped layers each doped with an n-type dopant at a concentration of $5 \times 10^{17} cm^{-3}$ and having a thickness of 10 nm are alternately stacked in an n-epitaxial layer (SiC) serving as the channel layer. The upper most portion of the channel layer is formed by the undoped layer having a thickness of 40 nm. A thermal oxide film is formed by dry oxidization that is performed at a temperature of 1180° C. for 3 hours. Although not shown in FIG. 17, a p-well region is provided below the n-epitaxial layer, and Al ions are implanted so that the p-well region has a dopant concentration of $1 \times 10^{18} cm^{-3}$ and a thickness of about 800 nm. After the ion implantation, activation annealing is carried out at a temperature of 1750° C. for 30 minutes. At a surface of the p-well region, a step having a height of 50 nm or more is formed due to this activation annealing. By evaluating the surface of the p-well region using AFM, we found that the average surface roughness Ra is 10 nm or more, and the maximum surface roughness Rmax is 50 nm or more. Therefore, a step having a height substantially similar to that of the step at the surface of the p-well region is also formed at the surface of the channel layer. The step does not rise perpendicularly, but forms a gentle slope. The thermal oxide film has a thickness of about 56 nm on a flat portion of the channel layer, and has a thickness of about 30 nm on a slope of the step, which is only a half of the thickness of the thermal oxide film on the flat portion. This is considered to be due to the fact that the flat portion and the step have different crystallographic plane orientations at their exposed surfaces, which varies the growth rate of the thermal oxide film. Furthermore, since a leakage current flows through a thin portion of the thermal oxide film on the slope of the step, this MISFET has a gate dielectric breakdown voltage of 10 V or less; accordingly, a sufficient voltage cannot be applied to a gate, and thus a sufficient electric current cannot be obtained.

Although the problems of the conventional power device have been described thus far by taking a vertical-type MISFET as an example, a lateral-type MISFET, a MESFET and a lateral-type Schottky diode also present the similar problems. This is because these power devices each have a structure in which carriers flow in parallel with the principal surface of a SiC substrate.

The present invention has been made in view of the above-described problems, and its object is to provide a semiconductor device in which carrier mobility in a channel layer is high, and a method for fabricating the semiconductor device.

An inventive semiconductor device is provided with an epitaxially grown layer on a silicon carbide layer including a high-concentration dopant diffused region; and a channel layer whose upper surface at a part of the epitaxially grown layer is smoother than that of the silicon carbide layer.

Thus, since the upper surface of the channel layer becomes smooth, the carrier mobility of the channel layer can be maintained at a high level. Further, even if the silicon carbide layer has a macro step due to step bunching, leakage current is small, and a high breakdown voltage is maintained because the upper surface of the channel layer is smooth.

In one embodiment, the semiconductor device may be further provided with an electrode that passes through the epitaxially grown layer to reach the high-concentration dopant diffused region. In such an embodiment, the semiconductor device having a high current drive capability can be easily obtained.

In another embodiment, an upper surface of the silicon carbide layer may be smoothed by polishing. In such an embodiment, the upper surface of the epitaxial grown layer, i.e., the upper surface of the channel layer, is smoothed.

In still another embodiment, the upper surface of the silicon carbide layer may be subjected to annealing with the silicon carbide layer covered with a carbon film. In such an embodiment, the need for a process such as polishing is eliminated, and practical application of the resulting device is facilitated.

In still yet another embodiment, the lateral size of a region where the channel layer and the high-concentration dopant diffused layer are overlapped may be greater than the thickness of the channel layer. In such an embodiment, the supply of carriers from the high-concentration dopant diffused region to the channel layer is ensured.

In another embodiment, the average surface roughness of a surface of the silicon carbide layer in contact with the channel layer is preferably 2 nm or less.

In still another embodiment, the average surface roughness of the upper surface of the channel layer is preferably 1 nm or less.

In stilly yet another embodiment, the channel layer has a stacked doped layer structure. In such an embodiment, the semiconductor device with an extremely high carrier mobility is obtained.

A high current drive capability is achieved if the above structure is employed in a vertical-type MISFET, a lateral-type MISFET and a lateral-type MESFET.

According to an inventive method for fabricating a semiconductor device, annealing for activating a dopant, which has been implanted into a high-concentration dopant diffused region formed in a part of a silicon carbide layer on a substrate, is carried out. Thereafter, an exposed surface of the silicon carbide layer including the high-concentration dopant diffused region is smoothed by CMP, mechanochemical polishing, dry etching or the like, and then a channel layer is formed on the silicon carbide layer including the high-concentration dopant diffused region.

In such a method, the surface of the silicon carbide layer including the high-concentration dopant diffused region becomes rough through the ion implantation and activation annealing. However, since the channel layer is formed on the surface of the silicon carbide layer smoothed by the subsequent process, the surface of the channel layer is also smooth. Accordingly, the semiconductor device in which carrier mobility at the channel layer is high is obtained.

According to the present invention, since a semiconductor device such as a MISFET or MESFET that uses a SiC substrate is provided with a channel layer whose surface is smooth, the semiconductor device having a high carrier mobility and a method for fabricating such a semiconductor device can be provided.

BRIEF DESCRIPTION OF THE DRAWINGS

FIGS. 11A and 11B are graphs showing the I-V characteristics of a vertical-type MISFET according to a reference example and a vertical-type MISFET according to the present embodiment.

DESCRIPTION OF THE PREFERRED EMBODIMENTS

First Embodiment

Figure 1:
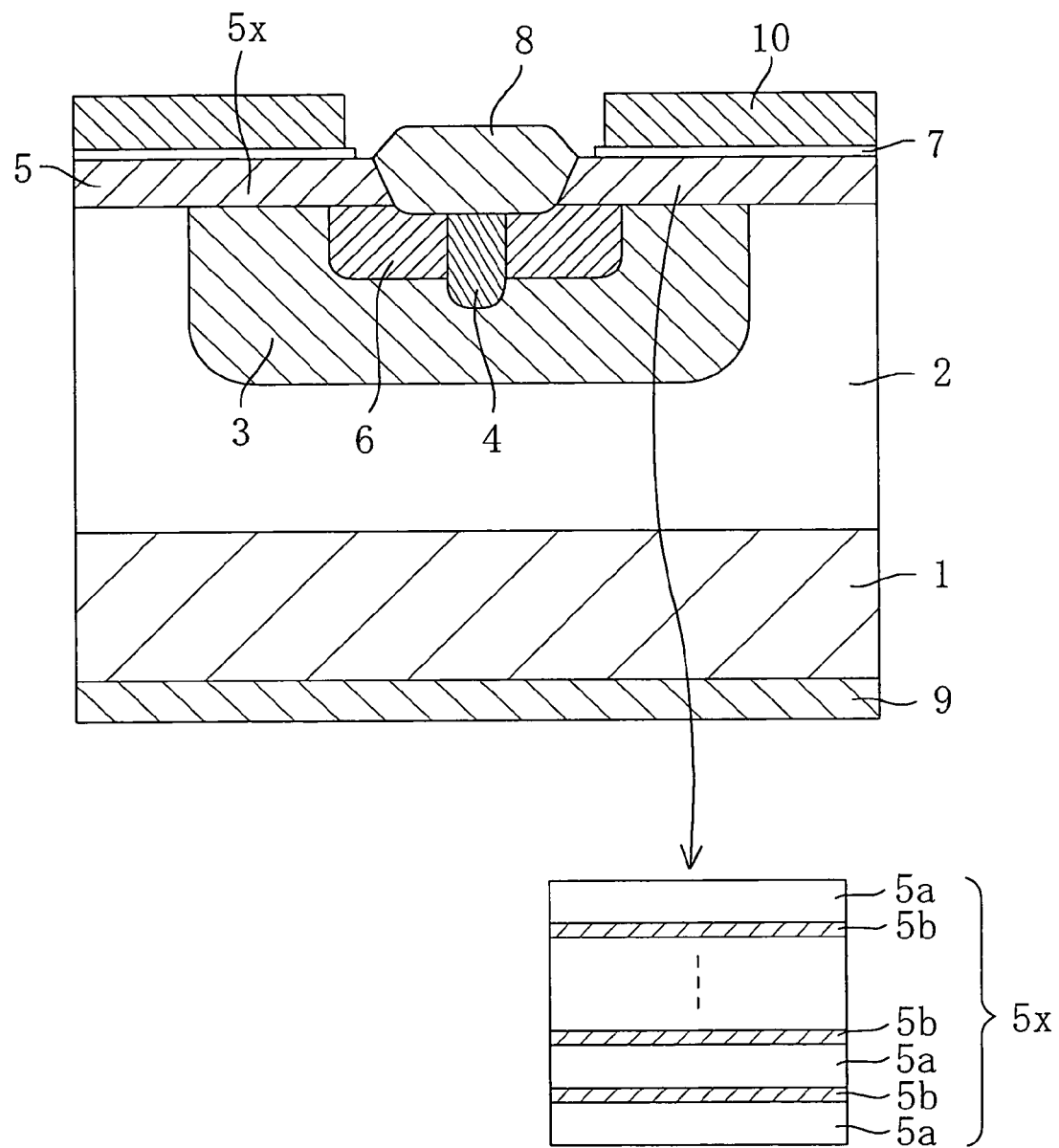
FIG. 1 a cross-sectional view illustrating the structure of a double-implantation MISFET according to a first embodiment of the present invention.

In the present embodiment, an accumulation-mode double-implantation MISFET that uses a bulk SiC substrate will be described as a first embodiment of the present invention. FIG. 1 is a cross-sectional view illustrating the structure of the double-implantation MISFET according to the first embodiment of the present invention. Although FIG. 1 shows only a partial cross-sectional structure of the MISFET, the planar structure thereof is similar to one disclosed in FIG. 2 or 10 of International Application PCT/JP01/07810, for example.

As shown in FIG. 1, the double-implantation MISFET includes: a low resistance SiC substrate 1 containing an n-type dopant at a concentration of $1\times10^{18} cm^{-3}$ or more; a high resistance SiC layer 2 provided on a principal surface of the SiC substrate 1 and containing an n-type dopant at a concentration of about $1\times10^{15} cm^{-3}$ to about $1\times10^{16} cm^{-3}$; a p-well region 3 formed by doping a part of a surface region of the high resistance SiC layer 2 with a p-type dopant at a concentration of $1\times10^{16} cm^{-3}$ to $1\times10^{18} cm^{-3}$; a p+ contact region 4 formed by doping a part of the p-well region 3 with a p-type dopant at a concentration of about $5\times10^{19} cm^{-3}$; a source region 6 formed by doping a part of the p-well region 3 with an n-type dopant at a concentration of about $1\times10^{19} cm^{-3}$; a channel layer 5x that is provided in a part of an epitaxially grown layer 5 formed to extend over the source region 6, the p-well region 3 and the high resistance SiC layer 2, and that includes a stacked doped layer structure; a gate insulating film 7 formed of a thermal oxide film provided on a surface of the channel layer 5x; a gate electrode 10 formed of an Al alloy film provided on the gate insulating film 7; a source electrode 8 formed of a Ni alloy film provided so as to be in contact with side surfaces of the channel layer 5x and upper surfaces of the source region 6 and the p+ contact region 4; and a drain electrode 9 formed of a Ni alloy film formed so as to be in ohmic contact with the backside of the SiC substrate 1. Wherein, in the present embodiment and each embodiment described later, the cannel layer means a region of the epitaxially grown layer which is located underneath the gate electrode in a MISFET and means a region located between the source region and the drain region in a MESFET.

During operation of the MISFET, if a bias equal to or higher than a threshold voltage is applied to the gate electrode 10 with a predetermined voltage applied between the source electrode 8 and the drain electrode 9, carriers are injected from the source electrode 8 into the channel layer 5x through the source region 6, and the carries travel from the channel layer 5x to the drain electrode 9 through the high resistance SiC layer 2 and the SiC substrate 1.

The surfaces of the high resistance SiC layer 2, the well region 3 and the source region 6 are smoothed, and the channel layer 5x is epitaxially grown on these surfaces. The channel layer 5x has a stacked doped layer structure formed by alternately stacking: a first semiconductor layer 5a functioning as a carrier-traveling region; and a second semiconductor layer 5b that is thinner than the first semiconductor layer 5a and contains a high-concentration n-type dopant for enabling supply of carries to the first semiconductor layer 5a. For example, each first semiconductor layer 5a has a dopant concentration of $1\times10^{16} cm^{-3}$ or less and a thickness of about 40 nm, and each second semiconductor layer 5b has a dopant concentration of about $1\times10^{17} cm^{-3}$ to about $1\times10^{18} cm^{-3}$ and a thickness of about 10 nm. For example, the first and second semiconductor layers 5a and 5b are alternately deposited for three cycles with the first semiconductor layer 5a formed as the lowermost layer of the channel layer 5x, and the first semiconductor layer 5a is further formed as the uppermost layer of the channel layer 5x. In this case, if each first semiconductor layer 5a has a thickness of 40 nm and each second semiconductor layer 5b has a thickness of 10 nm, the resulting channel layer 5x has a thickness of 190 nm.

It should be noted that as the stacked doped layer structure, a structure (multi-δ-doped layer structure), formed by alternately stacking: an undoped or not intentionally doped first semiconductor layer; and an extremely thin second semiconductor layer (δ-doped layer) doped at a high concentration, may be used.

The source region 6 and the high resistance SiC layer 2, each being an n-type semiconductor layer, are electrically continuous via the channel layer 5x that is also an n-type semiconductor layer. A portion of the channel layer 5x located on a part of the source region 6 and the p+ contact region 4 is alloyed with Ni by annealing, thereby changing this portion into the source electrode 8. The source electrode 8 is in ohmic contact with the source region 6 and the p+ contact region 4, while the drain electrode 9 is in ohmic contact with the SiC substrate 1.

FIGS. 2A through 2F and FIGS. 3A through 3E are cross-sectional views illustrating the process for fabricating the double-implantation MISFET of the first embodiment.

Figure 2A:
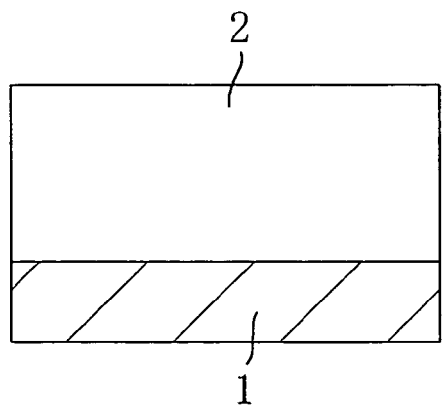
FIGS. 2A through 2F are cross-sectional views illustrating the first half of the process for fabricating the double-implantation MISFET of the first embodiment.

First, in the step shown in FIG. 2A, a SiC substrate 1 that is an off substrate having an off angle of 8° from the (0001) plane of 4H—SiC is prepared, and a high resistance SiC layer 2 having an n-type dopant concentration lower than that of the SiC substrate 1 is epitaxially grown on a principal surface of the SiC substrate 1 by a thermal CVD or the like. In this case, for example, silane ($SiH_4$) and propane ($C_3H_8$) are used as a material gas, hydrogen ($H_2$) is used as a carrier gas, and nitrogen ($N_2$) is used as a dopant gas. For example, if a MISFET having a breakdown voltage of 600 V, for example, is to be fabricated, the high resistance SiC layer 2 preferably has a dopant concentration of $1 \times 10^{15} cm^{-3}$ to $1 \times 10^{16} cm^{-3}$ and a thickness of 10 μm or more.

Figure 2D:
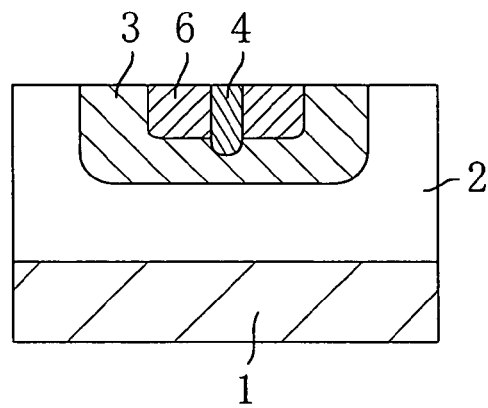
Figure 2B:
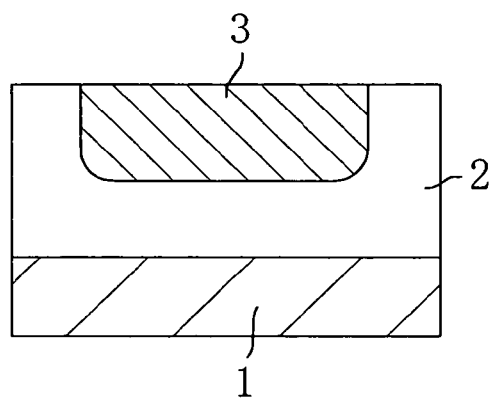

Next, in the step shown in FIG. 2B, p-type dopant (e.g., aluminum or boron) ions are implanted into a part of the epitaxially grown high resistance SiC layer 2, thus forming a p-well region 3. In forming the p-well region 3, first, a silicon oxide film serving as an implantation mask and having a thickness of about 3 μm is deposited on an upper surface of the high resistance SiC layer 2, and then photolithography and dry etching are carried out to provide an opening only in a portion of the silicon oxide film which will form the p-well region 3. Thereafter, aluminum or boron ions are implanted while substrate temperature is kept at as high as 500° C. or more in order to reduce implantation defects. After the ion implantation, the silicon oxide film used as the mask is removed by hydrofluoric acid. The p-well region 3 normally has a p-type dopant concentration of about $1 \times 10^{17} cm^{-3}$ to about $1 \times 10^{18} cm^{-3}$ and a depth of about 1 μm so as not to cause pinch-off.

Subsequently, in the step shown in FIG. 2C, in order to allow the p-well region 3 to make electrical contact with a source electrode 8 that will be subsequently formed, a p+ contact region 4 is formed by implanting high-concentration p-type dopant ions into a part of a surface region of the p-well region 3. The p+ contact region 4 has a thickness of about 300 nm and a dopant concentration of about $5 \times 10^{19} cm^{-3}$ or more. In this case, the ion implantation is performed in the same way as in the step of forming the p-well region 3. Since activation annealing is performed at a time after the subsequent ion implantation for a source region 6, no activation annealing is performed between the step shown in FIG. 2C and the step shown in FIG. 2D.

Next, in the step shown in FIG. 2D, high-concentration n-type dopant ions are implanted into a part of the surface region of the p-well region 3, thus forming the source region 6. In this step, a silicon oxide film serving as an implantation mask and having a thickness of about 1 μm is deposited over the substrate, and then photolithography and dry etching are carried out to provide an opening only in a portion of the silicon oxide film which will form the source region 6. Thereafter, nitrogen or phosphorus ions are implanted while the substrate temperature is kept at as high as 500° C. or more in order to reduce implantation defects. After the ion implantation, the silicon oxide film used as the mask is removed by hydrofluoric acid. The source region 6 has a dopant concentration of about $1 \times 10^{19} cm^{-3}$ which is lower than the dopant concentration of the p+ contact region 4. If the dopant concentration of the source region 6 is approximately similar to that of the p+ contact region 4, the implantation mask for formation of the source region 6 has to cover the p+ contact region 4. Furthermore, the source region 6 has a depth of about 300 nm, for example, which is shallower than that of the p+ contact region 4.

Figure 2E:
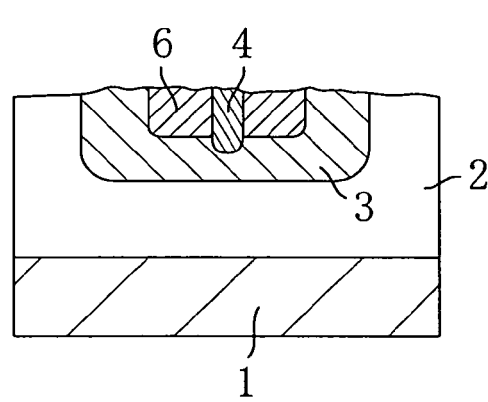
Figure 2C:
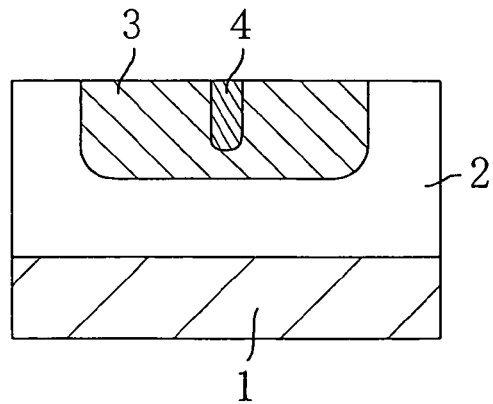

Then, in the step shown in FIG. 2E, in order to activate the dopants implanted in the steps shown in FIGS. 2B through 2D, activation annealing is performed at 1700° C. for 30 minutes in an atmosphere of an inert gas such as argon. At this time, a macro step or a hillock is formed at exposed surfaces of the high resistance SiC layer 2, the p-well region 3, the p+ contact region 4 and the source region 6, thus aggravating surface roughness and making surface smoothness poor.

Subsequently, in the step shown in FIG. 2F, mechanochemical polishing (MCP), for example, is performed to smooth the exposed surfaces of the high resistance SiC layer 2, the p-well region 3, the p+ contact region 4 and the source region 6. In this step, the exposed surfaces are smoothed until an average surface roughness Ra of the surfaces becomes 2 nm or less, preferably 1 nm or less. When MCP is performed, chromium oxide, for example, is used as abrasive grain. In order to remove a modifying layer formed at the surfaces due to the damage caused by polishing, reactive ion etching or sacrificial oxidation is performed. Alternatively, both of the reactive ion etching and the sacrificial oxidation may be performed. In the reactive ion etching, a gas mixture of, for example, $CF_4$ and $O_2$ is used, and the reactive ion etching is carried out at a minimum sample bias voltage so as not to cause damage resulting from ion impact. For example, if ICP-RIE in which inductively coupled plasma, for example, is used is performed, sample bias potential can be suppressed to 1 V or less. The surfaces are very shallowly etched to a depth of 0.1 μm or less, for example, such that doping profile is not damaged. In the sacrificial oxidization, the substrate is placed in a quartz tube, for example, and is kept at 1180° C. for 90 minutes while dry oxygen is flowing at a flow rate of 1 (1/min), thus forming a thermal oxide film with a thickness of about 40 nm at the surface. Thereafter, the thermal oxide film is removed by hydrofluoric acid. In this step, the SiC layer 2 is removed at its surface to a depth of a few tens of nanometers. By changing the conditions of the thermal oxidation, the depth of a portion of the SiC layer 2 to be removed can be controlled.

Figure 3A:
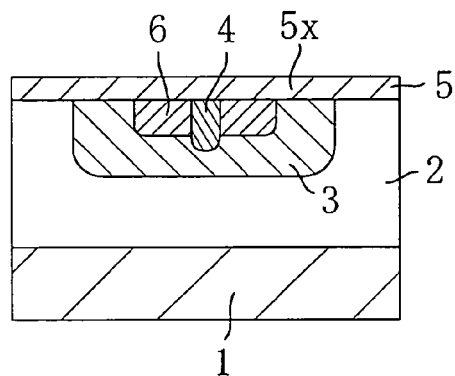
FIGS. 3A through 3E are cross-sectional views illustrating the latter half of the process for fabricating the double-implantation MISFET of the first embodiment.

Next, in the step shown in FIG. 3A, thermal CVD, for example, is carried out to epitaxially grow an epitaxially grown layer 5 including a channel layer 5x on the high resistance SiC layer 2, the p-well region 3, the source region 6 and the p+ contact region 4. In forming each second semiconductor layer 5b (see FIG. 1) within the epitaxially grown layer 5 (the channel layer 5x), silane ($SiH_4$) and propane ($C_3H_8$) are used as a material gas, hydrogen ($H_2$) is used as a carrier gas, and nitrogen ($N_2$) is used as a dopant gas, for example. On the other hand, in forming each first semiconductor layer 5a (see FIG. 1) within the epitaxially grown layer 5 (the channel layer 5x), silane ($SiH_4$) and propane ($C_3H_8$) are supplied as a material gas, and hydrogen ($H_2$) is supplied as a carrier gas, but a dopant gas is not supplied. By alternately repeating the thermal CVD, the stacked doped layer structure shown in FIG. 1 can be implemented.

Figure 3B:
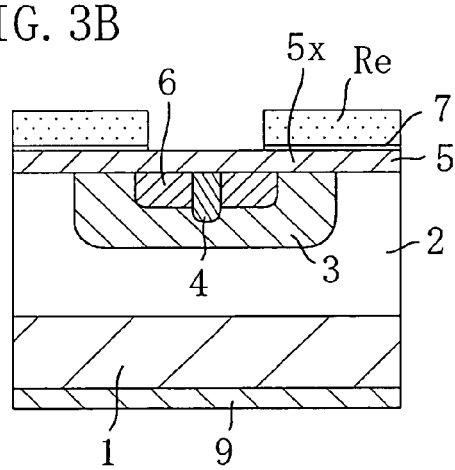

Subsequently, in the step shown in FIG. 3B, the surface of the epitaxially grown layer 5 (channel layer 5x), i.e., the stacked doped layer structure, is thermally oxidized, thus forming a silicon oxide film. In this step, the SiC substrate is placed in a quartz tube, for example, bubbling oxygen is introduced into the quartz tube at a flow rate of 2.5 (1/min), and thermal oxidation is carried out for 2.5 hours with the substrate temperature kept at 1180° C., thus forming the silicon oxide film that is a thermal oxide film having a thickness of about 60 nm.

Then, a drain electrode 9 formed of a nickel film with a thickness of 200 nm is formed on the backside of the SiC substrate 1 by a vapor deposition process. Annealing for the drain electrode 9 is performed after the subsequent formation of the source electrode 8.

Subsequently, photolithography is performed to form, on the silicon oxide film, a resist film Re opened in the region where the source electrode 8 will be formed, and then the silicon oxide film is patterned by hydrofluoric acid etching, thus forming a gate insulating film 7 surrounding the region where the source electrode 8 will be formed.

Figure 3C:
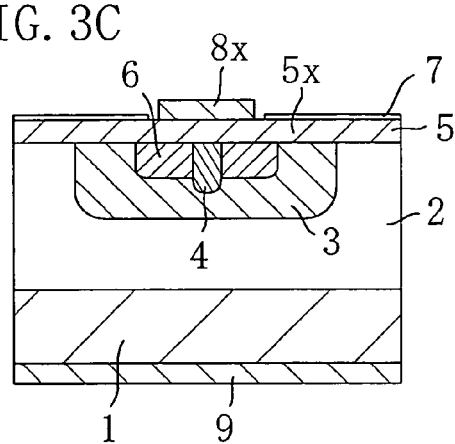

Thereafter, in the step shown in FIG. 3C, a nickel film (Ni film) having a thickness of 200 nm is deposited over the substrate by vacuum deposition while the resist film Re is still remaining, and then a lift-off process is performed, thus allowing a nickel film 8x serving as the source electrode 8 to remain.

Figure 3D:
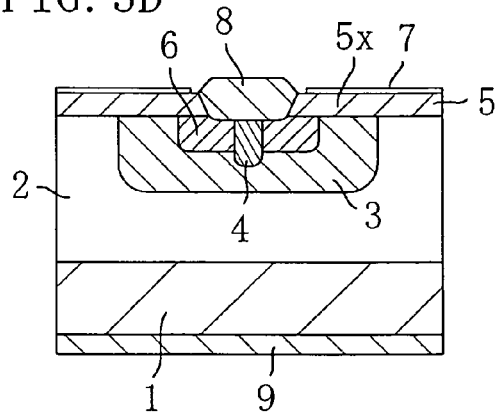

Next, in the step shown in FIG. 3D, the Ni film 8x is annealed at a temperature of 1000° C. for 2 minutes in an atmosphere of an inert gas such as nitrogen. During this annealing, mutual diffusion and reaction of nickel (Ni) and silicon carbide (SiC) occur, thus forming the source electrode 8 that mainly consists of nickel silicide and passes through the epitaxially grown layer 5 to reach the source region 6 and the p+ contact region 4. Furthermore, this annealing allows the drain electrode 9 to be in ohmic contact with the SiC substrate 1. Annealing for allowing the source and drain electrodes 8 and 9 to be in ohmic contact with each other may be performed at the same time, or may be performed separately.

Figure 3E:
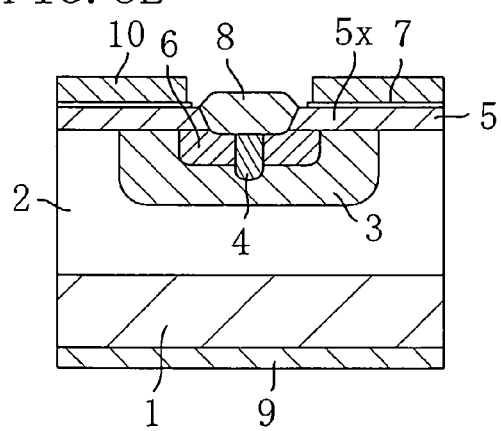

Subsequently, in the step shown in FIG. 3E, a gate electrode 10 is formed at a position on the gate insulating film 7 located at a distance from the source electrode 8. In this step, for example, an aluminum film having a thickness of about 200 nm is deposited by vacuum deposition or the like, and then normal photolithography and etching are carried out to pattern the aluminum film, thus forming the gate electrode 10.

Although the subsequent steps are not shown, a silicon oxide film having a thickness of about 1 µm is deposited as an interlayer dielectric film that covers the source and gate electrodes 8 and 10. Thereafter, RIE or the like is performed to form via holes that pass through the interlayer dielectric film and reach the source and gate electrodes 8 and 10, an aluminum film having a thickness of about 2 µm is deposited by vacuum deposition or the like, and then normal photolithography and etching are carried out to pattern the aluminum film, thus forming electrode pads and/or interconnects.

Thus, the double-implantation MISFET is completed. We evaluated the cross section of the channel region of this MISFET by using TEM, and only observed irregularities having an average surface roughness Ra of 1 nm or less at lower and upper surfaces of the channel layer. Accordingly, favorable smoothness is realized. Further, the thickness of the gate insulating film 7 is 50 nm to 65 nm, which is uniform in the range of about 10%. And the breakdown voltage of the gate insulating film 7 is maintained at 40 V or more. The channel mobility of this MISFET is as high as 100 cm$^2$/Vsec or more, the off-state breakdown voltage thereof is 600 V, and the on-state resistance thereof is 10 mΩ·cm$^2$ or less.

According to the present embodiment, prior to formation of the epitaxially grown layer 5 including the channel layer 5x, the surfaces of the underlying layers (which are the high resistance SiC layer 2 and the p-well region 3 in the present embodiment) are smoothed, and then the epitaxially grown layer 5 is epitaxially grown. Therefore, the irregularities that prevent travel of carriers in the channel layer 5x can be reduced, and the carrier mobility can be maintained at a high level. In particular, since the upper and lower surfaces of the channel layer 5x are flat, carries are not dispersed when they travel, thus making it possible to increase the channel mobility and to reduce the on-state resistance.

Moreover, it is possible to suppress an increase in leakage current flowing via the gate insulating film 7, which is caused by the existence of a macro step at the surface, and it is also possible to maintain the gate breakdown voltage at a high level.

Suppose the channel layer 5x has the stacked doped layer structure, in particular. In that case, it is known that if the irregularities of the channel layer 5x are greater than the thickness of the δ-doped layer (which is the second semiconductor layer 5b shown in FIG. 1), the travel of carriers is adversely affected. In the present embodiment, it is possible to easily obtain the channel layer 5x having irregularities (surface roughness) smaller than the thickness (10 nm) of the δ-doped layer (the second semiconductor 5b), and thus it is possible to surely achieve high driving power and high breakdown voltage since the channel layer 5x has the stacked doped layer structure.

Further, since the source region 6 is located below the channel layer 5x, activation annealing does not have to be performed after the deposition of the channel layer 5x, thus maintaining the surface smoothness after the deposition.

Furthermore, in the prior art, the source region is formed after the deposition of the channel layer; therefore, activation annealing has to be performed prior to and subsequent to the step of carrying out epitaxial growth. In the present invention, since the source region 6 is formed below the channel layer 5x, activation annealing for ion-implanted regions can be performed at a time. That is, the present invention also achieves the advantage that the fabrication process can be simplified.

Besides, unlike the conventional process in which the source region 6 is formed by ion implantation after the deposition of the epitaxially grown layer 5 including the channel layer 5x, the present embodiment carries out the above-described fabrication process to employ the structure in which the source region 6 and the channel layer 5x overlap with each other. Thus, the contact area between the source region 6 and the channel layer 5x can be increased, resulting in a reduction in contact resistance.

Figure 4A:
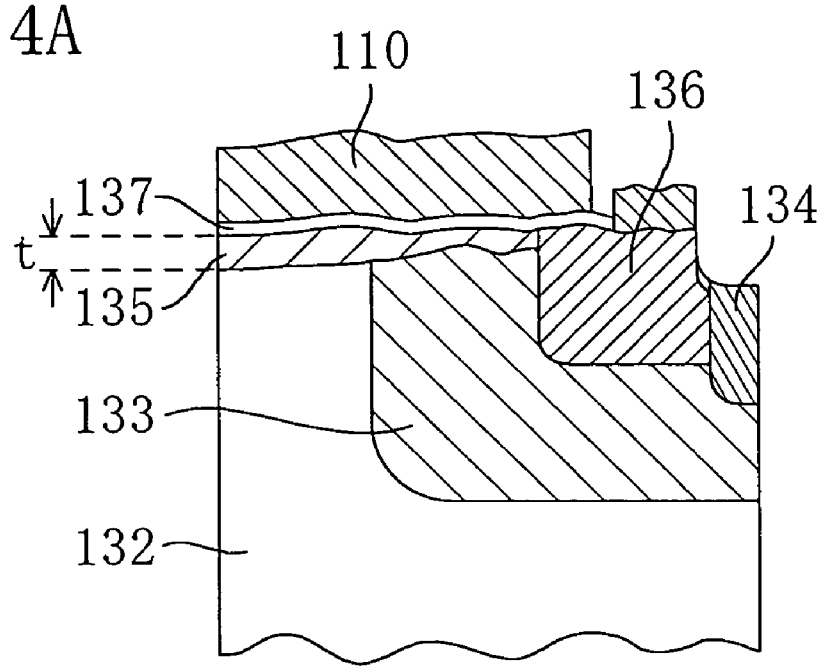
FIGS. 4A and 4B are cross-sectional views showing a difference in the way a source region and a channel layer are overlapped between a conventional MISFET that uses a SiC substrate and an inventive MISFET.
Figure 4B:
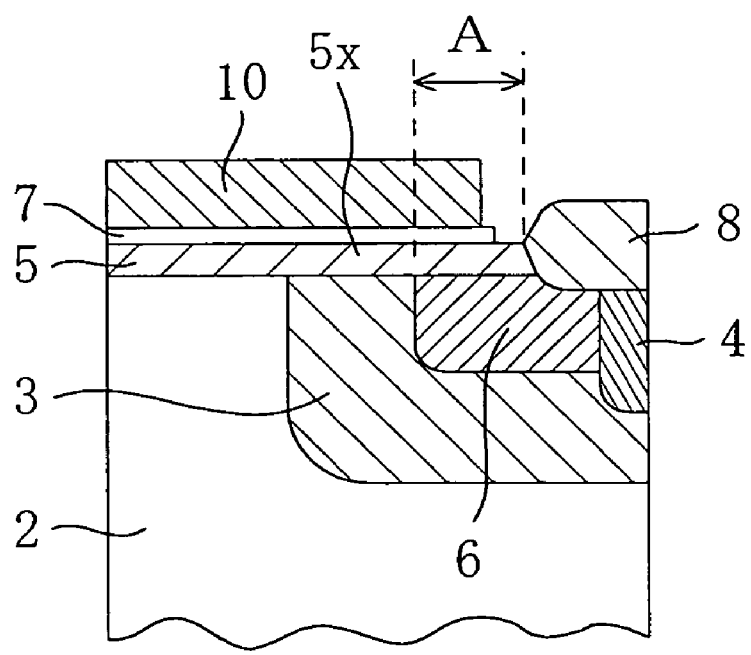

FIGS. 4A and 4B are cross-sectional views showing a difference in the way the source region and the channel layer are overlapped between the conventional MISFET that uses a SiC substrate and the inventive MISFET.

As shown in FIG. 4A, in the conventional MISFET, the source region 136 passes through the channel layer 135; therefore, the contact length between the source region 136 and the channel layer 135 in this cross section cannot be equal to or greater than the thickness t of the channel layer 135 (which is about 200 nm). To the contrary, as shown in FIG. 4B, in the present embodiment, the upper surface of the source region 6 and the lower surface of the channel layer 5x are in contact with each other; therefore, the contact length A between the channel layer 5x and the source region 6 in this cross section can be comparatively freely set. During operation of the MISFET, carries flow from the source electrode 8 to the channel layer 5x via the source region 6. Thus, the larger the contact area between the channel layer 5x and the source region 6, the more efficiently carries can be injected. Therefore, the contact length A in this cross section is preferably equal to or greater than the thickness of the channel layer 5x. For example, the contact length A is preferably 1 µm or more.

In the present embodiment, the channel layer 5x has the stacked doped layer structure in which the first and second semiconductor layers 5a and 5b having different concentrations are stacked. Alternatively, the entire channel layer may have a substantially uniform n-type dopant concentration. In that case, the n-type dopant concentration is preferably about $1 \times 10^{16}$ cm$^{-3}$ to about $5 \times 10^{17}$ cm$^{-3}$, and the thickness of the channel layer is preferably about 200 nm. Optionally, no stacked doped layer structure is provided, and a channel layer having concentration distribution in which an n-type dopant concentration is varied in a depth direction may be provided.

In addition, the present embodiment utilizes a chemical reaction between the metal film deposited on the surface of the epitaxially grown layer 5 (which is the Ni film in the present embodiment) and SiC without etching the epitaxially grown layer 5, thereby forming the source electrode 8 that passes through the epitaxially grown layer 5 to reach the source region 6. Therefore, the fabrication process can be considerably simplified, a reduction in fabrication cost can be achieved, and practical application of the resulting device is facilitated.

In the present embodiment, mechanochemical polishing (MCP) is performed as a process for smoothing surface irregularities created by annealing after ion implantation. Alternatively, isotropic dry etching may be performed in a plasma atmosphere using a gas containing a halogen element such as fluorine. Further, if MCP is performed, abrasive grain directly contacts the surface, and a chemical. solution is used; therefore, contamination is likely to occur, and cleaning has to be carried out. To the contrary, if dry etching that uses radicals is performed, contamination is unlikely to occur because the dry etching is a dry process. As the isotropic dry etching, a so-called down-flow etching may be performed. Specifically, in the down-flow etching, a sample is separated from a plasma-generating chamber, for example, only neutral activated species (radicals) are transported to the sample, and etching is carried out by a chemical reaction between the activated species and the sample surface. Alternatively, even if etching in which a sample is placed in a plasma chamber is performed, contamination is unlikely to occur as long as an etching method that can set a sample bias independently of a bias for plasma generation as in ICP etching is employed so that the sample bias is set at a minimum level and ion energy is minimized. As the plasma, a gas containing a halogen element, such as a gas mixture of $CF_4$ and $O_2$, is used.

In the present invention, the gate insulating film does not necessarily have to be a thermal oxide film. Alternatively, the gate insulating film may be a silicon oxide film deposited by CVD or the like. Optionally, the gate insulating film may have a multilayer structure including a thermal oxide film and a deposition film. Besides, the gate insulating film does not have to be a silicon oxide film. Alternatively, the gate insulating film may be a metal oxide film such as a silicon nitride film, a silicon oxynitride film, a tantalum oxide film, or a hafnium oxide film.

Second Embodiment

A semiconductor device according to a second embodiment of the present invention has a structure apparently similar to that of the double-implantation MISFET in the first embodiment shown in FIG. 1, and therefore, the structure of the MISFET according to the second embodiment is not shown. The MISFET of the present embodiment is greatly different from that of the first embodiment in that the surfaces of the high resistance SiC layer 2, the well region 3 and the source region 6 are not smoothed, and the surface smoothness is maintained by activation annealing performed with the high resistance SiC layer 2, the well region 3 and the source region 6 covered with a carbon film. Furthermore, the epitaxially grown layer 5 including the channel layer 5x is epitaxially grown on the high resistance SiC layer 2, the well region 3 and the source region 6. The channel layer 5x (the epitaxially grown layer 5) according to the present embodiment has an internal structure similar to that of the channel layer 5x according to the first embodiment shown in FIG. 1, and has the stacked doped layer structure as described in the first embodiment.

FIGS. 5A through 5F are cross-sectional views illustrating the process for fabricating the double-implantation MISFET according to the second embodiment.

First, in the step shown in FIGS. 5A through 5D, the steps similar to those shown in FIGS. 2A through 2D are carried out. To be more specific, the high resistance SiC layer 2 is epitaxially grown on the principal surface of the SiC substrate 1, and then ion implantation masks each of which is a hard mask are individually used so that the epitaxially grown high resistance SiC layer 2 is partially doped with a p-type dopant (such as aluminum or boron) by ion implantation to form the p-well region 3, and the surface region of the p-well region 3 is partially doped with a high-concentration n-type dopant by ion implantation to form the source region 6.

Figure 5A:
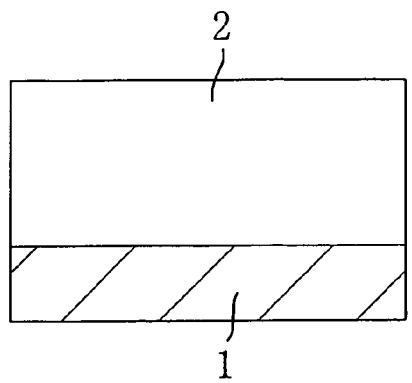
FIGS. 5A through 5F are cross-sectional views illustrating the first half of the process for fabricating a double-implantation MISFET according to a second embodiment of the present invention.
Figure 5B:
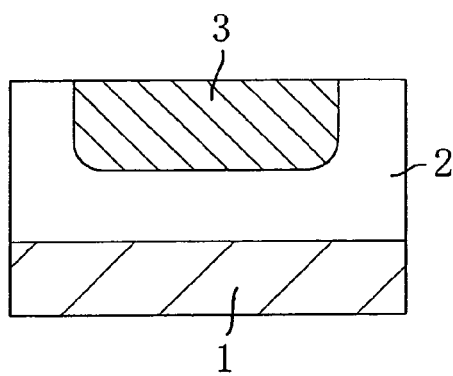
Figure 5C:
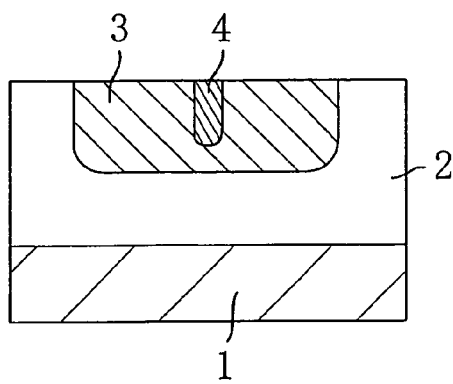
Figure 5D:
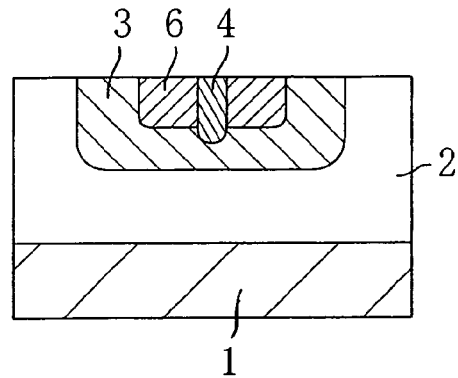
Figure 5E:
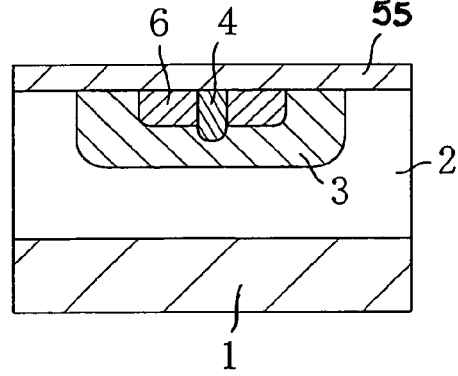

Next, in the step shown in FIG. 5E, after the ion implantation mask has been removed, a carbon film 55 is deposited on the high resistance SiC layer 2, the well region 3 and the source region 6. The carbon film 55 is deposited in the following manner. First, the SiC substrate 1 is placed at a substrate mounting part of a sputtering evaporation apparatus (not shown), and the evacuation of a chamber is carried out using a gas exhaust system. At this time, the degree of vacuum is approximately $10^{-4}$ Pa. After the evacuation of the chamber has been carried out using the gas exhaust system, an Ar gas is introduced, and an electric power of 100 W is applied to a target of a carbon plate at a pressure of about $10^{-2}$ Pa and a frequency as high as 13.56 MHz, thus carrying out sputtering evaporation. As a result of carrying out the evaporation for about 20 minutes, the carbon film 55 having a thickness of 50 nm is formed. It is confirmed that the content of components contained in the carbon film 55, such as hydrogen other than carbon, is small, and the carbon film 55 has a carbon content of 99% or more.

Subsequently, the SiC substrate 1 covered with the carbon film 55 is placed in an annealing apparatus (not shown), and a gas for anneal atmosphere is supplied through a gas supply system. As the gas for anneal atmosphere, an argon gas is selected. The flow rate of the argon gas is set at 0.5 l/min. The pressure within a chamber is kept constant at 91 kPa. Thereafter, the substrate temperature is increased to 1750° C., and annealing for activating the dopant, implanted into the high resistance SiC layer 2, the well region 3 and the source region 6, is carried out for 30 minutes while the substrate is maintained at this temperature. Then, the application of high-frequency electric power to a coil is stopped to finish heating while the argon gas is still supplied, and the substrate is cooled down.

Figure 5F:
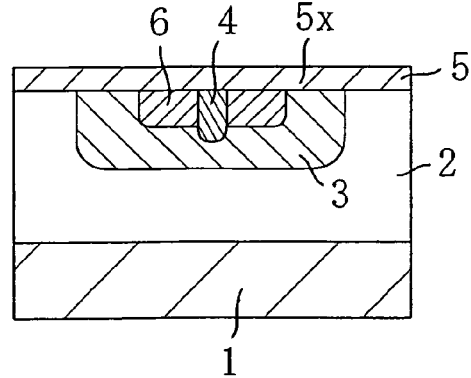

Next, in the step shown in FIG. 5F, the carbon film 55 is uniformly melted and removed using a solution of sulfuric acid and hydrogen peroxide water mixed at 3:1. In this case, the mixed solution hardly melts SiC layer 2, and removes only the carbon film 55.

Subsequently, the SiC substrate is placed within a furnace for thermal oxidation in order to completely remove the carbon film 55, and oxygen is supplied at a flow rate of 5 l/min and the substrate is heated to 800° C. Although the carbon film 55 over the surface of the substrate is substantially completely removed by heating the substrate for 30 minutes, the heating is carried out for 60 minutes in the present embodiment. As a result, in the present embodiment, the percentage of activation of aluminum is 90% or more, meaning that the sufficient percentage of activation has been obtained.

In the present embodiment, the average surface roughness Ra of the high resistance SiC layer 2, the well region 3 and the source region 6 after the removal of the carbon film 55 is about 2 nm or less. For example, we obtained the data indicating that the average surface roughness Ra is about 0.9 nm to about 1.3 nm. That is, less surface roughness is caused due to the activation annealing.

Since the ion-implanted regions are covered with the carbon film 55 that is formed by the sputtering process, the surface roughness caused by sublimation of substance from the ion-implanted regions is suppressed. That is, the carbon film formed by the sputtering process has a high density, and is stable at a temperature as high as 1600° C., and therefore, the composition, structure and thickness of the carbon film substantially do not change. Accordingly, if the surfaces of the ion-implanted regions before the annealing are smooth, the smoothness of the surfaces of the ion-implanted regions can be maintained even after the annealing.

Subsequently, the epitaxially grown layer 5 including the channel layer 5x is epitaxially grown on the high resistance SiC layer 2, the well region 3 and the source region 6 from which the carbon film 55 has been removed. The conditions of the epitaxial growth are similar to those described in the step shown in FIG. 3A according to the first embodiment.

We obtained the data indicating that the average surface roughness Ra of the channel layer 5x immediately after the epitaxial growth is about 0.08 nm to about 0.8 nm. That is, we have found that the surface roughness of the epitaxially grown layer is smaller than that of the underlying layer. In other words, a smoothing phenomenon is caused in the epitaxial growth.

Figure 18:
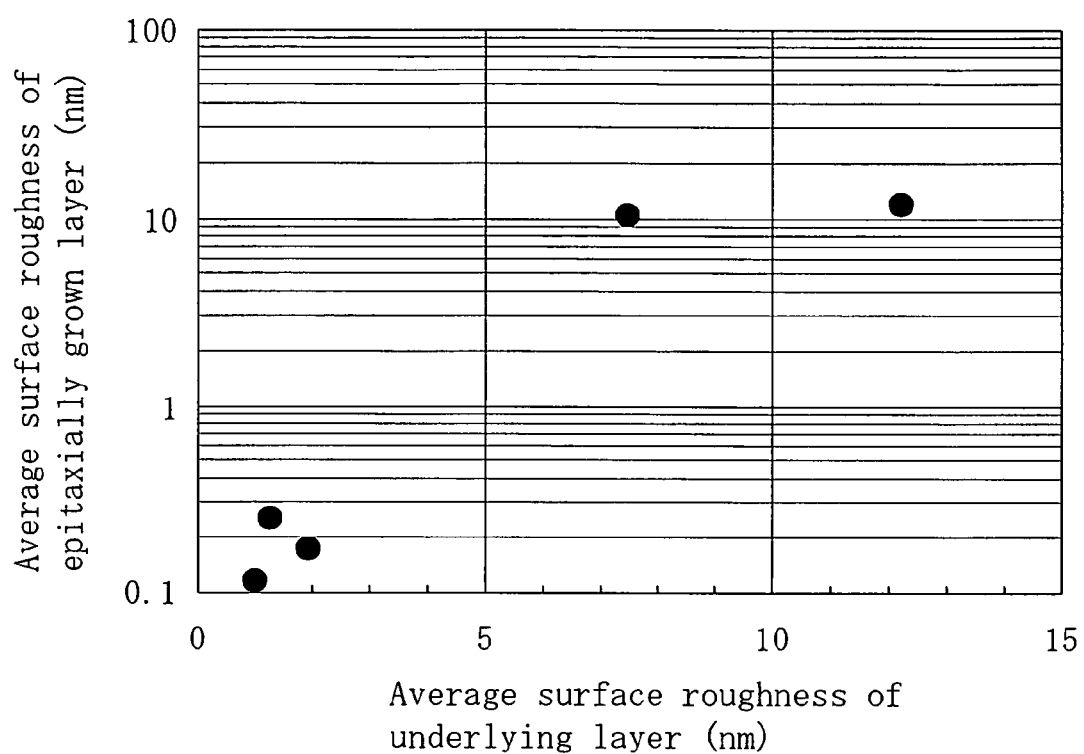
FIG. 18 is a graph showing a correlation between an average surface roughness Ra of an underlying layer before epitaxial growth and an average surface roughness Ra of an epitaxially grown layer in the process for fabricating the double-implantation MISFET according to the second embodiment of the present invention.

FIG. 18 is a graph showing the correlation between the average surface roughness Ra of the underlying layer before the epitaxial growth and the average surface roughness Ra of the epitaxially grown layer epitaxially grown thereon. According to FIG. 18, in the case where the average surface roughness Ra of the underlying layer is 7 nm or more, the average surface roughness Ra of the epitaxially grown layer epitaxially grown thereon is increased more than the average surface roughness Ra of the underlying layer. To the contrary, in the case where the average surface roughness Ra of the underlying layer is 2 nm or less, the average surface roughness of the epitaxially grown layer epitaxially grown thereon is 1 nm or less, meaning that the epitaxially grown layer is smoothed.

Specifically, we obtained the data indicating that if the surface roughness Ra of the high resistance SiC layer 2, the well region 3 and the source region 6 before the epitaxial growth (and after the annealing performed with the substrate covered with the carbon film) is 1.3 nm, the average surface roughness Ra of the channel layer 5x immediately after the epitaxial growth is 0.78 nm, and if the surface roughness Ra of the high resistance SiC layer 2, the well region 3 and the source region 6 before the epitaxial growth (and after the annealing performed with the substrate covered with the carbon film) is 0.9 nm, the average surface roughness Ra of the channel layer 5x immediately after the epitaxial growth is 0.08 nm.

Thus, the semiconductor device has the source region (or source/drain region in the case of lateral-type MISFET and MESFET) as the underlying layer for epitaxial growth for formation of the channel layer, and the surface roughness of the channel layer after the epitaxial growth is smaller than that of the underlying layer. That is, the structural feature of each of the inventive vertical-type MISFET and the MESFET and lateral-type MISFET according to the aftermentioned embodiments is that the surface of the resulting device is smoother.

The subsequent steps are not shown and not described since they are similar to those shown in FIGS. 3B through 3E according to the first embodiment.

According to the fabrication method of the present embodiment, in addition to the effects of the first embodiment, the following effects can be achieved. Since the average surface roughness Ra of the underlying layers for epitaxial growth (which are the high resistance SiC layer 2, the well region 3 and the source region 6 in the present embodiment) is 2 nm or less due to the dopant activation process with the carbon film being deposited, the average surface roughness Ra of the channel layer 5x immediately after the epitaxial growth can be further reduced. Such a smoothing phenomenon in the epitaxial growth becomes conspicuous when the average surface roughness Ra of the underlying layers is about 1.5 nm or less. However, the average surface roughness Ra of the underlying layers does not necessarily have to be 1.5 nm or less. As a result, it is seen that the MISFET of the present embodiment can achieve a high current drive capability, in particular.

Figure 14:
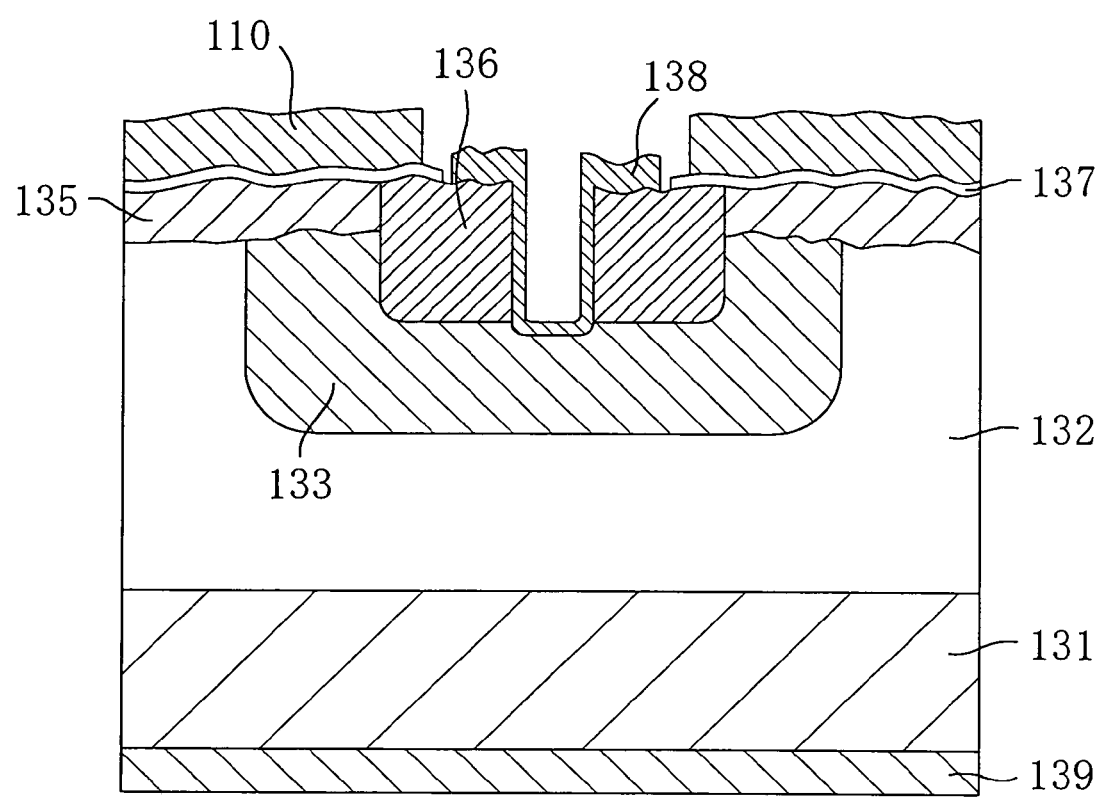
FIG. 14 is a cross-sectional view illustrating the structure of a conventional accumulation-mode MISFET that uses a SiC substrate, i.e., a conventional double-implantation MISFET.
Figure 15A:
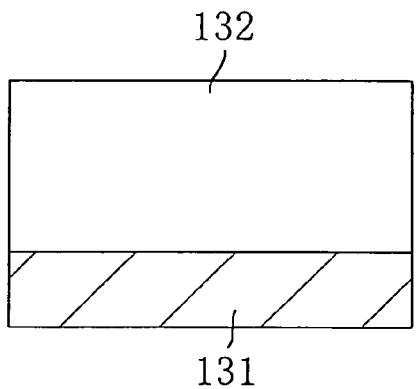
FIGS. 15A through 15E are cross-sectional views illustrating the first half of the process for fabricating the conventional double-implantation MISFET.
Figure 15B:
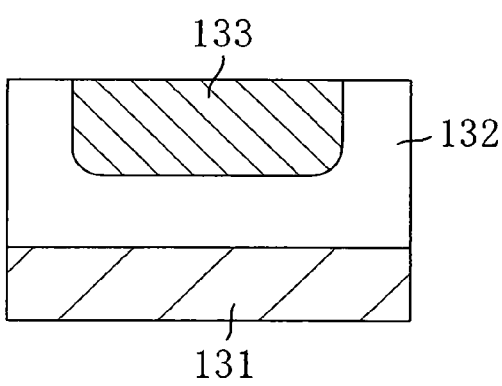
Figure 15C:
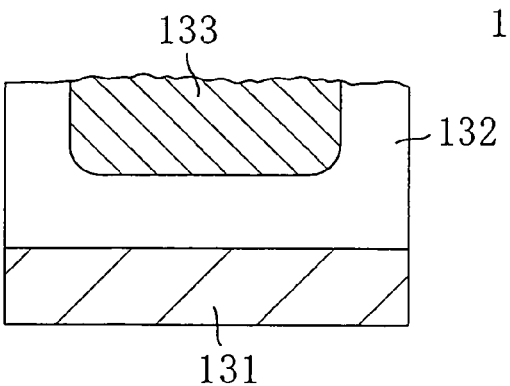
Figure 15D:
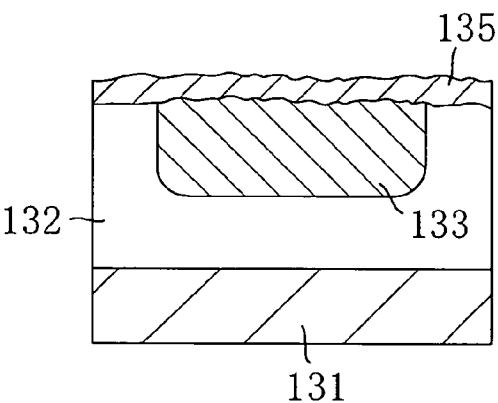
Figure 15E:
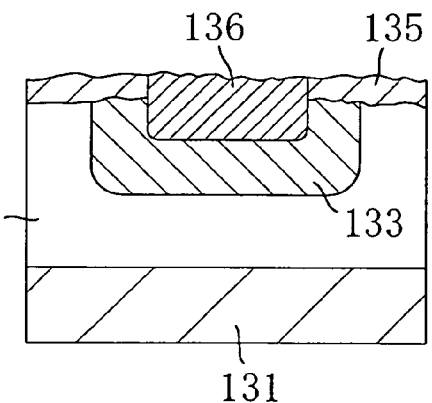
Figure 16A:
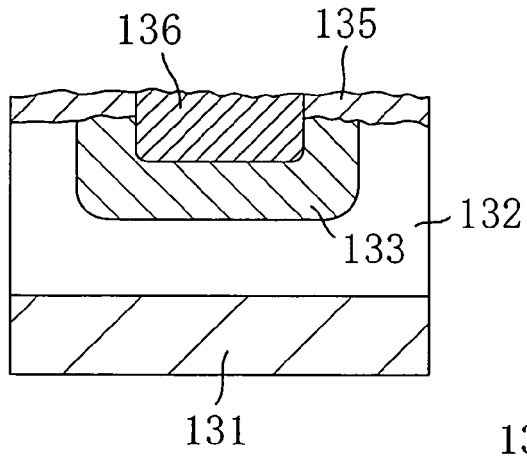
FIGS. 16A through 16E are cross-sectional views illustrating the latter half of the process for fabricating the conventional double-implantation MISFET.
Figure 16B:
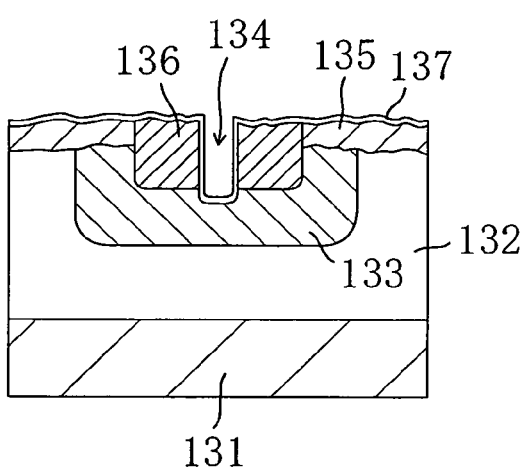
Figure 16C:
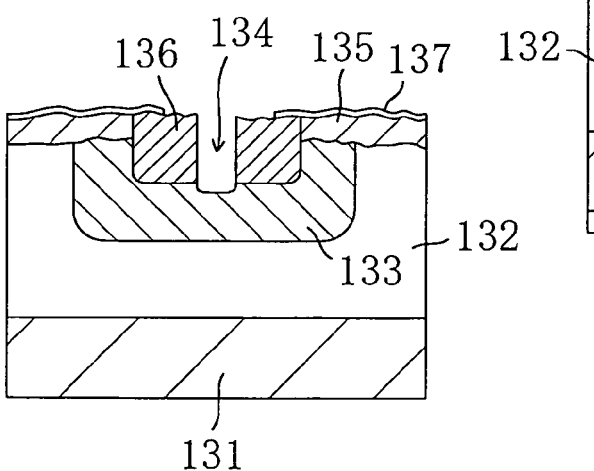
Figure 16D:
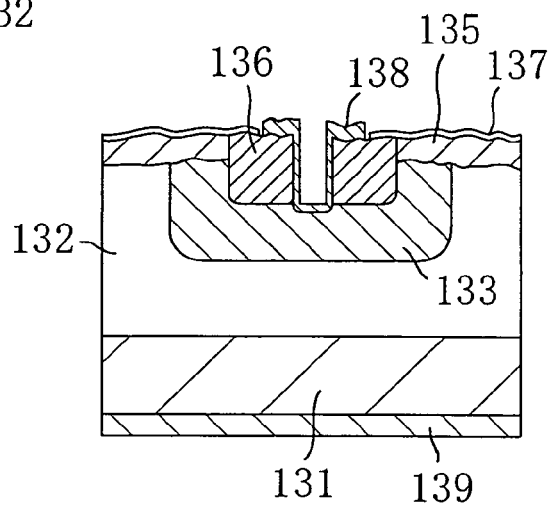
Figure 16E:
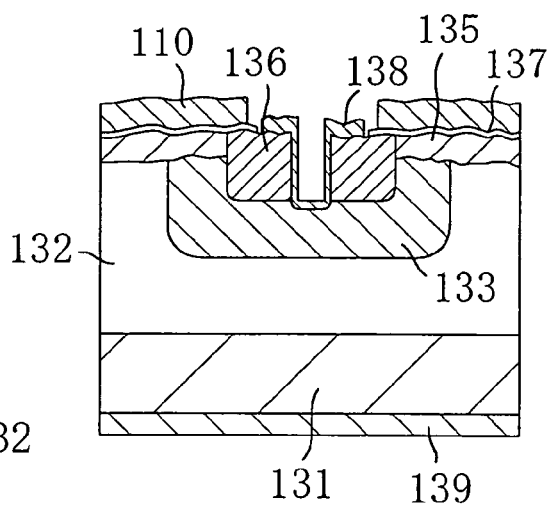
Figure 17:
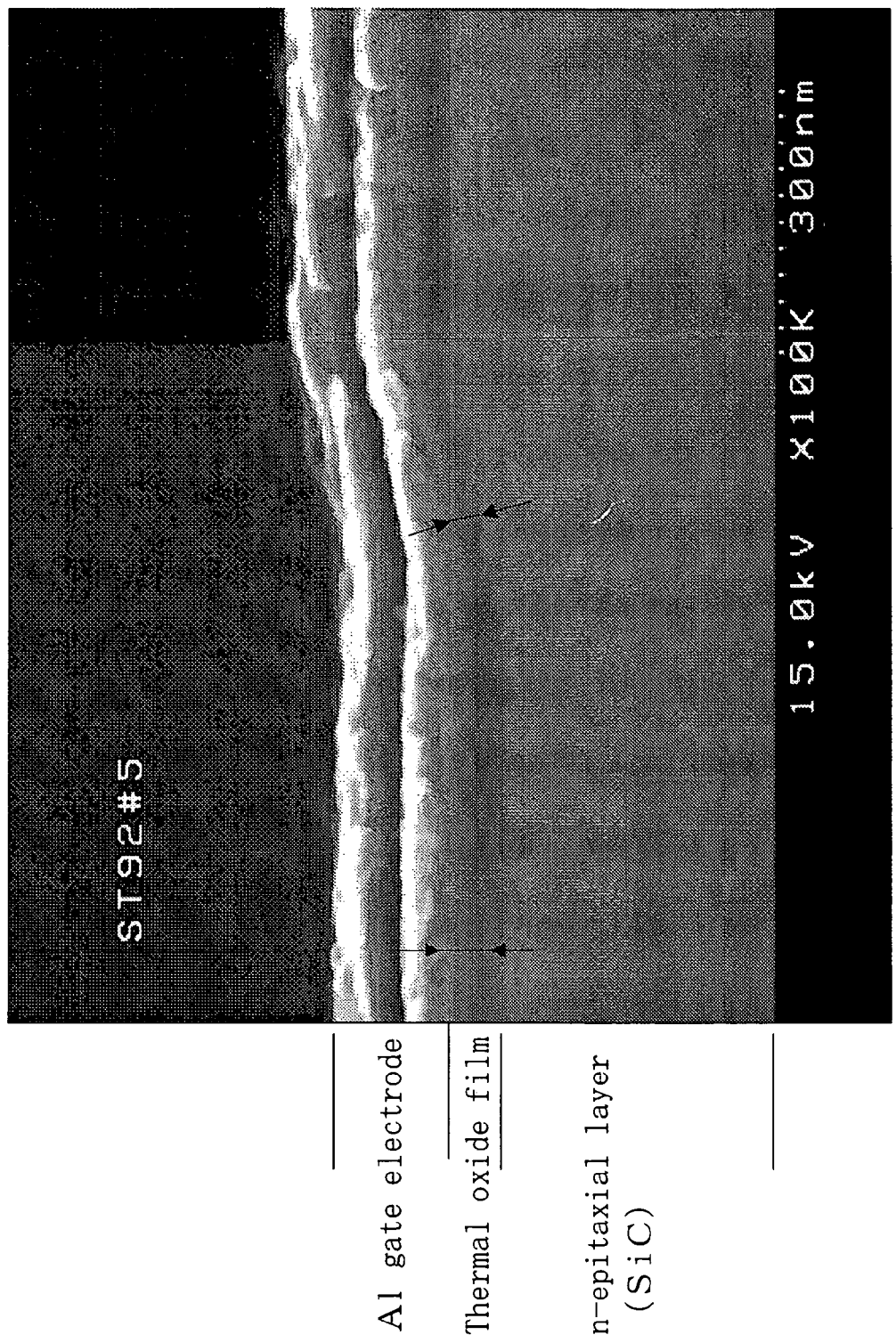
FIG. 17 is an SEM photograph showing the structure of an accumulation-mode double-implantation MISFET in the vicinity of a channel layer, which is substantially similar to that of the MISFET disclosed in Nonpatent Document 2.

FIGS. 11A and 11B are graphs showing the I-V characteristics of a vertical-type MISFET according to a reference example and a vertical-type MISFET according to the present embodiment. It is to be noted that the data shown in FIG. 11A is not about the MISFET having the structure of the conventional MISFET shown in FIG. 14, but about the MISFET whose basic shape is substantially similar to the structure shown in FIG. 14. In this MISFET, after ion implantation for formation of the source region 136 has been performed, the source region is covered with a carbon film to perform dopant activation annealing, and the average surface roughness Ra of the channel layer 135 is about 1 nm. On the other hand, the average surface roughness Ra of the channel layer 5x of the MISFET according to the present embodiment shown in FIG. 11B is about 0.1 nm. Each of the MISFETs has a gate length of 3 μm and a well spacing of 3 μm. As shown in FIGS. 11A and 11B, if comparison is made using a common gate bias, it is seen that the current drive capability of the vertical-type MISFET according to the present embodiment is higher than that of the vertical-type MISFET according to the reference example. Since the current drive capability of the vertical-type MISFET according to the reference example is higher than that of the conventional vertical-type MISFET shown in FIG. 14, the current drive capability of the vertical-type MISFET according to the present embodiment is considerably higher than that of the conventional vertical-type MISFET.

Figure 12:
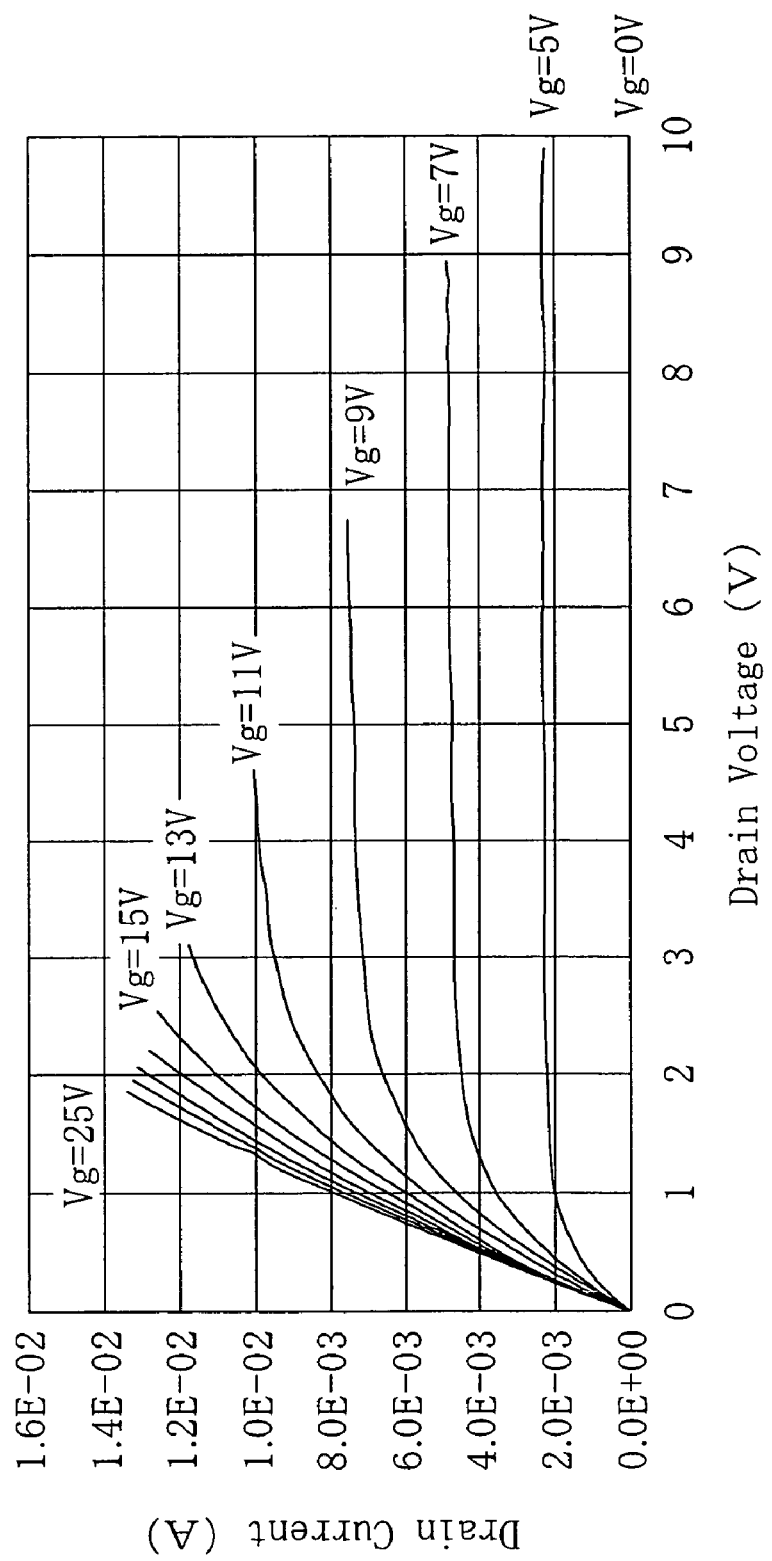
FIG. 12 is a graph showing the I-V characteristic of the vertical-type MISFET of the present embodiment.

Furthermore, FIG. 12 is a graph showing the I-V characteristic of the vertical-type MISFET of the present embodiment. The data shown in FIG. 12 is about a vertical-type MISFET including 9 cells (the actual vertical-type MISFET often includes about 1000 cells). The cell structure is the same as the sample with which the data shown in FIGS. 11A and 11B are obtained. By calculating an on-state resistance from the I-V characteristic shown in FIG. 12, a value of 12 mΩ·cm² is obtained. Since the on-state resistance of a vertical-type MISFET formed on a Si substrate is about 100 mΩ·cm², it is seen that the vertical MISFET of the present embodiment exhibits a high current drive capability and a low on-state resistance.

Furthermore, as indicated by the data about the aftermentioned lateral-type MISFET, it is also seen that the vertical-type MISFET of the present embodiment exhibits a high carrier mobility of 70 cm²/Vs, and a small threshold voltage variation.

Figure 2F:
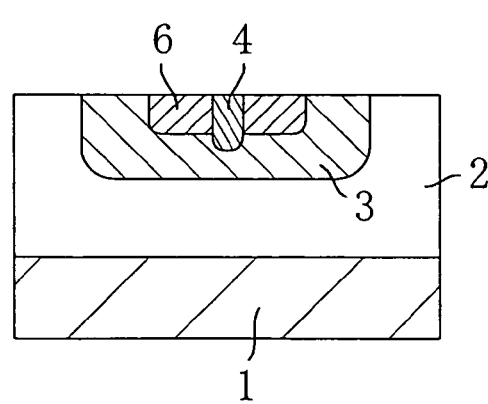

Epitaxial growth may be performed after the surfaces of the high resistance SiC layer 2 and the well region 3 have been smoothed by MCP as in the step shown in FIG. 2F according to the first embodiment. Even in such a case, the surface of the channel layer 5x immediately after the epitaxial growth can be further smoothed. However, since the smoothing process by MCP requires a long period of time and a deep etching amount, the fabrication method of the present embodiment is more advantageous than that of the first embodiment since the fabrication method of the present embodiment can further reduce the fabrication cost.

Third Embodiment

FIGS. 6A through 6F are cross-sectional views illustrating the process for fabricating a double-implantation MISFET according to a third embodiment of the present invention.

Figure 6A:
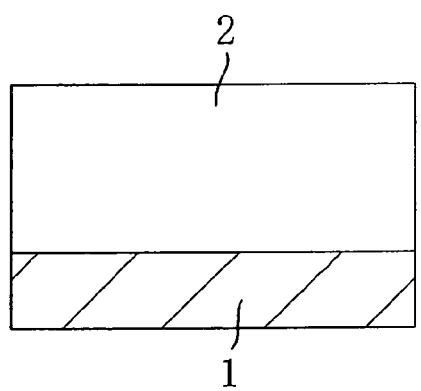
FIGS. 6A through 6F are cross-sectional views illustrating the first half of the process for fabricating a double-implantation MISFET according to a third embodiment of the present invention.

First, in the step shown in FIG. 6A, the step similar to that shown in FIG. 2A according to the first embodiment is carried out, thus epitaxially growing a high resistance SiC layer 2 on a principal surface of a SiC substrate 1 that is an off-substrate having an off angle of 8° from the (0001) plane of 4H—SiC.

Figure 6B:
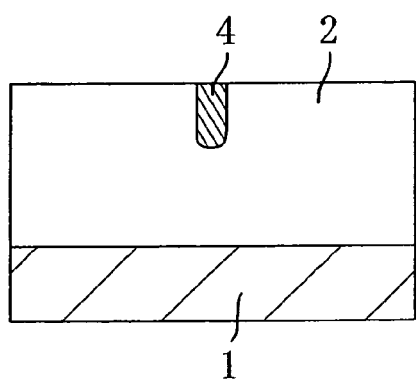

Next, in the step shown in FIG. 6B, the step similar to that shown in FIG. 2C according to the first embodiment is carried out. Thus, a p+ contact region 4 is formed by implanting high-concentration p-type dopant ions into a part of a surface region of the high resistance SiC layer 2 in order to allow a p-well region and a source electrode, which will be subsequently formed, to be in electrical contact with each other. The p+ contact region 4 has a dopant concentration of about $5 \times 10^{19} cm^{-3}$ or more.

Figure 6C:
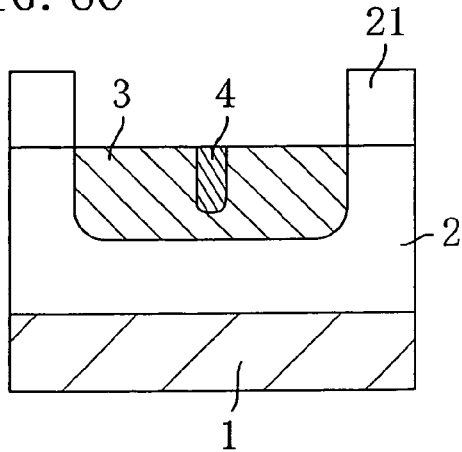

Thereafter, in the step shown in FIG. 6C, the high resistance SiC layer 2 is partially doped with p-type dopant ions (such as aluminum or boron ions), thus forming the p-well region 3. In forming the p-well region 3, first, a silicon oxide film 21 that serves as an implantation mask and has a thickness of about 3 μm is deposited on an upper surface of the high resistance SiC layer 2, and only a portion of the silicon oxide film 21 where the p-well region 3 is to be formed is provided with an opening. Then, aluminum (Al) or boron (B) ions are implanted while substrate temperature is kept at a high temperature of 500° C. or more in order to reduce implantation defects. The p-well region 3 normally has a p-type dopant concentration of about $1 \times 10^{17} cm^{-3}$ to $1 \times 10^{18} cm^{-3}$ and a depth of about 1 μm so as not to cause pinch-off.

Figure 6D:
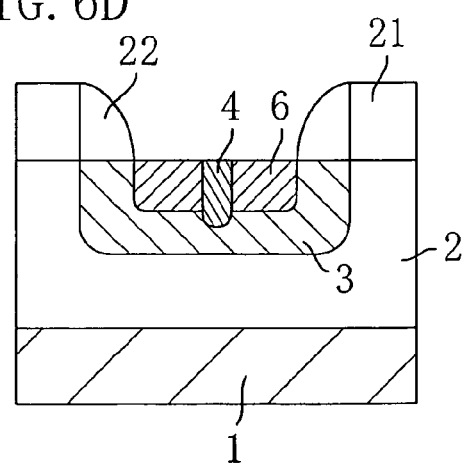

Subsequently, in the step shown in FIG. 6D, a polysilicon film for covering the silicon oxide film 21 (which has been used as the implantation mask), the well region 3 and the p+ contact region 4 is deposited, and the polysilicon film is subjected to selective and anisotropic etching, thus forming sidewalls 22 on side surfaces of the silicon oxide film 21. In forming these sidewalls 22, no photolithography process is required, and a photo mask does not have to be used; therefore, a source region 6 will be formed to be self-aligned with the p-well region 3.

Then, using the silicon oxide film 21 and the sidewalls 22 as a mask, a surface region of the p-well region 3 is partially doped with a high-concentration n-type dopant by ion implantation, thus forming the source region 6. In this case, in order to reduce implantation defects, nitrogen or phosphorus ions are implanted while the substrate is maintained at a temperature as high as 500° C. or more.

Figure 6E:
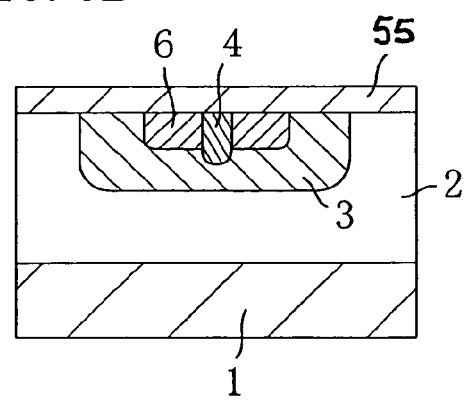

Next, in the step shown in FIG. 6E, the silicon oxide film 21 and the sidewalls 2, which have been used as a mask, are removed by selective dry etching or a process that uses hydrofluoric acid. The source region 6 has a dopant concentration of about $5 \times 10^{19} cm^{-3}$ which is lower than that of p+ contact region 4. Further, the depth of the source region 6 is shallower than that of the p+ contact region 4, and is about 300 nm, for example.

Then, a carbon film 55 is deposited on the high resistance SiC layer 2, the well region 3 and the source region 6. The carbon film 55 is deposited in the following manner. First, the SiC substrate 1 is placed at a substrate mounting part of a sputtering evaporation apparatus not shown), and the evacuation of a chamber is carried out using a gas exhaust system. At this time, the degree of vacuum is approximately $10^{-4}$ Pa. After the evacuation of the chamber has been carried out using the gas exhaust system, an Ar gas is introduced, and an electric power of 100 W is applied to a target of a carbon plate at a pressure of about $10^{-2}$ Pa and a frequency as high as 13.56 MHz, thus carrying out sputtering evaporation. As a result of carrying out the evaporation for about 20 minutes, the carbon film 55 having a thickness of 50 nm is formed. It is confirmed that the content of components contained in the carbon film 55, such as hydrogen other than carbon, is small, and the carbon film 55 has a carbon content of 99% or more.

Subsequently, the SiC substrate 1 covered with the carbon film 55 is placed in an annealing apparatus (not shown), and a gas for anneal atmosphere is supplied through a gas supply system. As the gas for anneal atmosphere, an argon gas is selected. The flow rate of the argon gas is set at 0.5 l/min. The pressure within a chamber is kept constant at 91 kPa. Thereafter, the substrate temperature is increased to 1750° C., and annealing for activating the dopant, implanted into the high resistance SiC layer 2, the well region 3 and the source region 6, is carried out for 30 minutes while the substrate is maintained at this temperature. Then, the application of high-frequency electric power to a coil is stopped to finish heating while the argon gas is still supplied, and the substrate is cooled down.

Figure 6F:
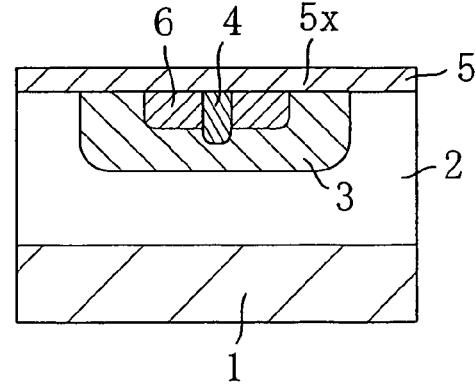

Next, in the step shown in FIG. 6F, the carbon film 55 is uniformly melted and removed using a solution of sulfuric acid and hydrogen peroxide water mixed at 3:1. In this case, the mixed solution hardly melts SiC layer 2, and removes only the carbon film 55.

Subsequently, the SiC substrate is placed within a furnace for thermal oxidation in order to completely remove the carbon film 55, and oxygen is supplied at a flow rate of 5 l/min and the substrate is heated to 800° C. Although the carbon film 55 over the surface of the substrate is substantially completely removed by heating the substrate for 30 minutes, the heating is carried out for 60 minutes in the present embodiment. As a result, in the present embodiment, the percentage of activation of aluminum is 90% or more, meaning that the sufficient percentage of activation has been obtained.

In the present embodiment, the average surface roughness Ra of the high resistance SiC layer 2, the well region 3 and the source region 6 after the removal of the carbon film 55 is about 2 nm or less as in the second embodiment. For example, we obtained the data indicating that the average surface roughness Ra is about 0.9 nm to about 1.3 nm. That is, no surface roughness is caused due to the activation annealing.

Subsequently, the epitaxially grown layer 5 including the channel layer 5x is epitaxially grown on the high resistance SiC layer 2, the well region 3 and the source region 6 from which the carbon film 55 has been removed. The conditions of the epitaxial growth are similar to those described in the step shown in FIG. 3A according to the first embodiment.

Also in the present embodiment, we obtained the data indicating that the average surface roughness Ra of the channel layer 5x immediately after the epitaxial growth is about 0.08 nm to about 0.8 nm. That is, the surface roughness of the channel layer 5x is smaller than that of the epitaxially grown underlying layers, thus causing a smoothing phenomenon in the epitaxial growth. Specifically, we obtained the data indicating that if the surface roughness Ra of the high resistance SiC layer 2, the well region 3 and the source region 6 before the epitaxial growth (and after the annealing performed with the substrate covered with the carbon film) is 1.3 nm, the average surface roughness Ra of the channel layer 5x immediately after the epitaxial growth is 0.78 nm, and if the surface roughness Ra of the high resistance SiC layer 2, the well region 3 and the source region 6 before the epitaxial growth (and after the annealing performed with the substrate covered with the carbon film) is 0.9 nm, the average surface roughness Ra of the channel layer 5x immediately after the epitaxial growth is 0.08 nm.

The subsequent steps are not shown and not described since they are similar to those shown in FIGS. 3B through 3E according to the first embodiment.

According to the present embodiment, in addition to the effects of the second embodiment, the following effects can be achieved. In the present embodiment, in the step shown in FIG. 6C, the sidewalls 22 are formed on the side surfaces of the silicon oxide film 21 that is an implantation mask for the formation of the p-well region 3, and then ion implantation for the formation of the source region 6 is carried out using the silicon oxide film 21 and the sidewalls 22 as an implantation mask. Therefore, since the source region 6 is formed so as to be self-aligned with the p-well region 3, the width of the p-well region 3 in the cross section shown in FIG. 6E (i.e., the distance between the source region 6 and the high resistance SiC layer 2) becomes nearly constant, thus making the channel length substantially uniform. That is, the electrical characteristic of the MISFET that uses the SiC substrate is stabilized.

Fourth Embodiment

Figure 7:
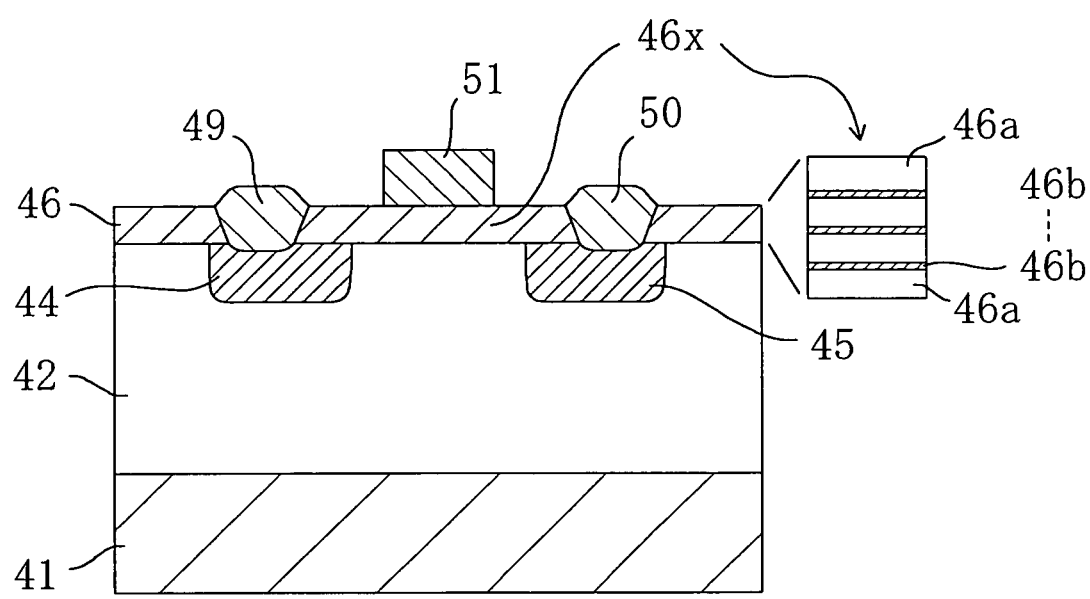
FIG. 7 is a cross-sectional view illustrating the structure of a MESFET that is a lateral-type transistor according to a fourth embodiment of the present invention.

FIG. 7 is a cross-sectional view illustrating the structure of a MESFET that is a lateral-type transistor according to a fourth embodiment of the present invention.

As shown in FIG. 7, the MESFET of the present embodiment includes: an intrinsic SiC substrate 41 that is an insulating substrate; an undoped high resistance SiC layer 42 epitaxially grown on the SiC substrate 41; source and drain regions 44 and 45 formed by doping each of two separate regions within the high resistance SiC layer 42 with an n-type dopant; an epitaxially grown layer 46 including a channel layer 46x epitaxially grown on the high resistance SiC layer 42; a source electrode 49 formed of a Ni alloy film that passes through a portion of the channel layer 46x, located above the source region 44, to reach the source region 44; a drain electrode 50 formed of a Ni alloy film that passes through a portion of the channel layer 46x, located above the drain region 45, to reach the drain region 45; and a Schottky gate electrode 51 that is formed on a region of the channel layer 46x located between the source electrode 49 and the drain electrode 50.

The channel layer 46x has a stacked doped layer structure formed by alternately stacking: a first semiconductor layer 46a functioning as a carrier-traveling region; and a second semiconductor layer 46b that is thinner than the first semiconductor layer 46a and contains a high-concentration n-type dopant for enabling supply of carries to the first semiconductor layer 46a. For example, each first semiconductor layer 46a has a dopant concentration of $1\times10^{16} cm^{-3}$ or less and a thickness of about 40 nm, and each second semiconductor layer 46b has a dopant concentration of about $1\times10^{17} cm^{-3}$ to about $1\times10^{18} cm^{-3}$ and a thickness of about 10 nm. For example, the first and second semiconductor layers 46a and 46b are alternately deposited for three cycles with the first semiconductor layer 46a formed as the lowermost layer of the channel layer 46x, and the first semiconductor layer 46a is further formed as the uppermost layer of the channel layer 46x. In this case, if each first semiconductor layer 46a has a thickness of 40 nm and each second semiconductor layer 46b has a thickness of 10 nm, the resulting channel layer 46x has a thickness of 190 nm.

FIGS. 8A through 8E and FIGS. 9A through 9C are cross-sectional views illustrating the process for fabricating the MESFET of the present embodiment.

Figure 8A:
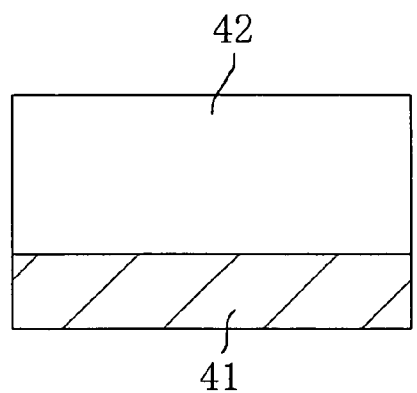
FIGS. 8A through 8E are cross-sectional views illustrating the first half of the process for fabricating a MESFET of the fourth embodiment.

First, in the step shown in FIG. 8A, thermal CVD or the like is performed to epitaxially grow an undoped high resistance SiC layer 42 on a principal surface of a SiC substrate 41 that is an off-substrate having an off angle of 8° from the (0001) plane of 4H—SiC. In this case, silane ($SiH_4$) and propane ($C_3H_8$) are used as a material gas, and hydrogen ($H_2$) is used as a carrier gas. The high resistance SiC layer 42 preferably has a thickness of a few μm, for example.

Figure 8B:
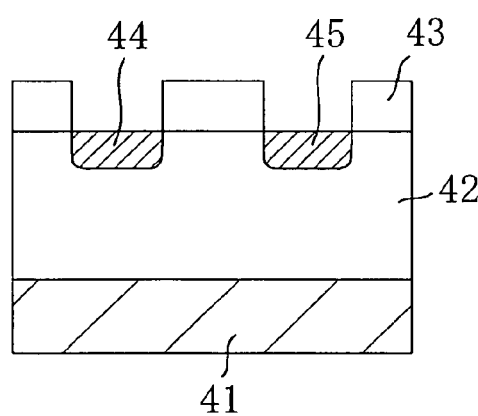

Next, in the step shown in FIG. 8B, nitrogen or phosphorus ions as an n-type dopant are implanted into the separate regions of the high resistance SiC layer 42, thus forming source and drain regions 44 and 45. In forming the source and drain regions 44 and 45, a CVD process is performed to deposit a silicon oxide film with a thickness of about 1 μm, which serves as an implantation mask, on the high resistance SiC layer 42, and thereafter photolithography and dry etching are performed to form openings in portions of the silicon oxide film 43 located above the source and drain regions 44 and 45. Then, nitrogen or phosphorus ions are implanted while the substrate is maintained at a temperature as high as 500° C. in order to reduce implantation defects. After the ion implantation, the silicon oxide film 43 is removed by using hydrofluoric acid.

In this case, the source and drain regions 44 and 45 normally have an n-type dopant concentration of $1\times10^{18} cm^{-3}$ or more, and a depth of about 0.3 μm.

Figure 8C:
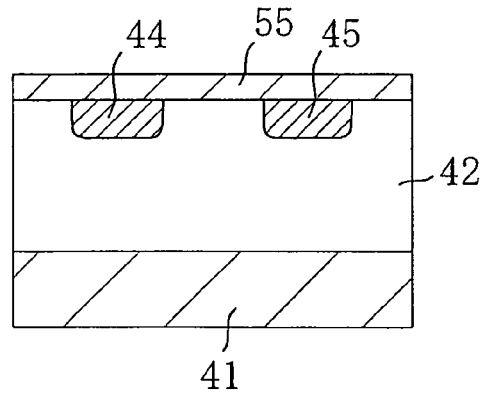

Subsequently, in the step shown in FIG. 8C, in order to activate the dopant implanted in the step shown in FIG. 8B, activation annealing is performed at a temperature of 1750° C. for 30 minutes in an atmosphere of an inert gas such as argon, with a carbon film 55 deposited over the substrate. The deposition of the carbon film 55 and the annealing are carried out in the same way as in the step shown in FIG. 5E according to the second embodiment.

Figure 8D:
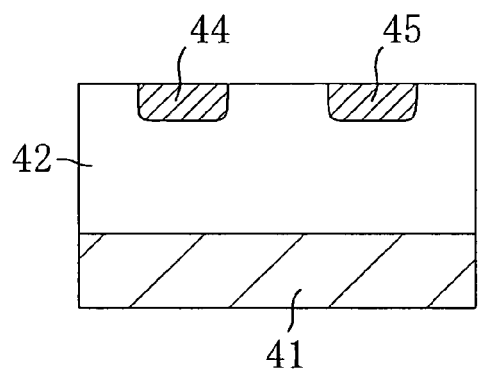

Thereafter, in the step shown in FIG. 8D, the carbon film 55 is removed. In this step, a process that uses a solution of sulfuric acid and hydrogen peroxide water mixed at 3:1, and a heating process in a furnace for thermal oxidation are performed in the same way as in the step shown in FIG. 5F according to the second embodiment, and the conditions of the processes are the same as those in the step shown in FIG. 5F according to the second embodiment.

Figure 8E:
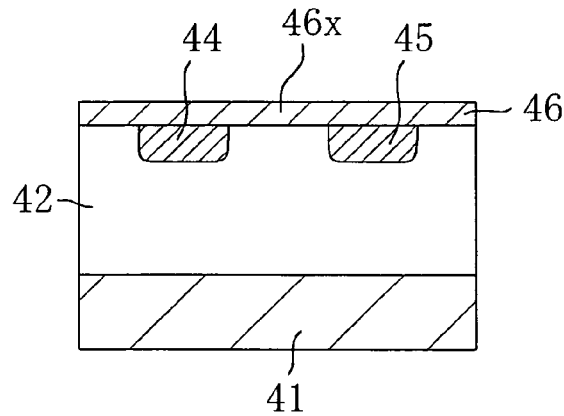

Thereafter, in the step shown in FIG. 8E, the epitaxially grown layer 46 including the channel layer 46x is epitaxially grown by thermal CVD, for example. In forming each second semiconductor layer 46b (see FIG. 7) in the channel layer 46x, silane ($SiH_4$) and propane ($C_3H_8$) are used as a material gas, hydrogen ($H_2$) is used as a carrier gas, and nitrogen ($N_2$) is used as a dopant gas. On the other hand, in forming each first semiconductor layer 46a (see FIG. 7) in the channel layer 46x, silane ($SiH_4$) and propane ($C_3H_8$) are used as a material gas, and hydrogen ($H_2$) is used as a carrier gas. By alternately repeating the thermal CVD, the stacked doped layer structure shown in FIG. 7 can be achieved.

Figure 9A:
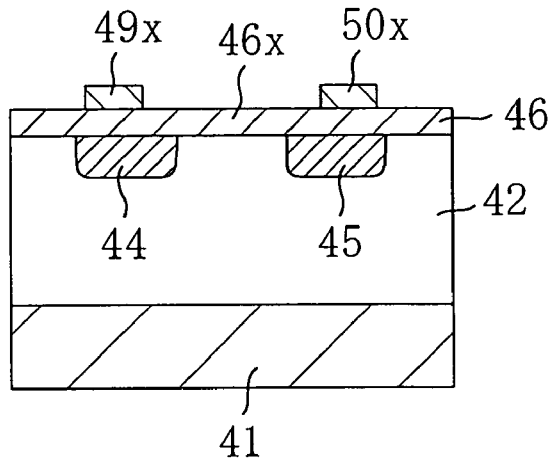
FIGS. 9A through 9C are cross-sectional views illustrating the latter half of the process for fabricating the MESFET of the fourth embodiment.

Next, in the step shown in FIG. 9A, the process similar to the shown in FIG. 3C according to the first embodiment is performed on a portion of the epitaxially grown layer 46 located on the source and drain regions 44 and 45. More specifically, a lift-off process is performed using a resist film Re (not shown), thereby allowing Ni films 49x and 50x, each having a thickness of 200 nm, to remain over the substrate.

The Ni films 49x and 50x will serve as source and drain electrodes 49 and 50, respectively.

Figure 9B:
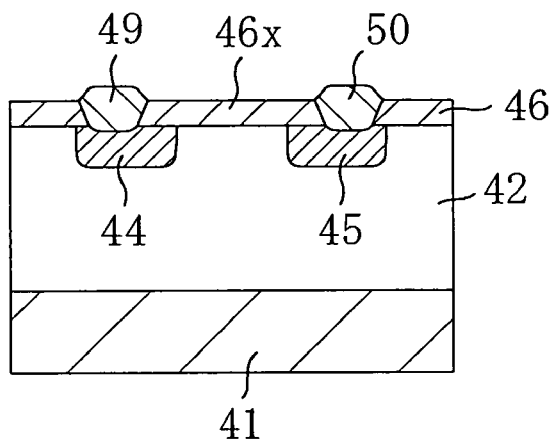

Subsequently, in the step shown in FIG. 9B, the Ni films 49x and 50x are annealed at temperature of 1000° C. for 2 minutes in an atmosphere of an inert gas such as nitrogen. During this annealing, mutual diffusion and reaction of nickel (Ni) and silicon carbide (SiC) occur, thus forming the source and drain electrodes 49 and 50 mainly consisting of nickel silicide and passing through the channel layer 46x to reach the source and drain regions 44 and 45, respectively.

Figure 9C:
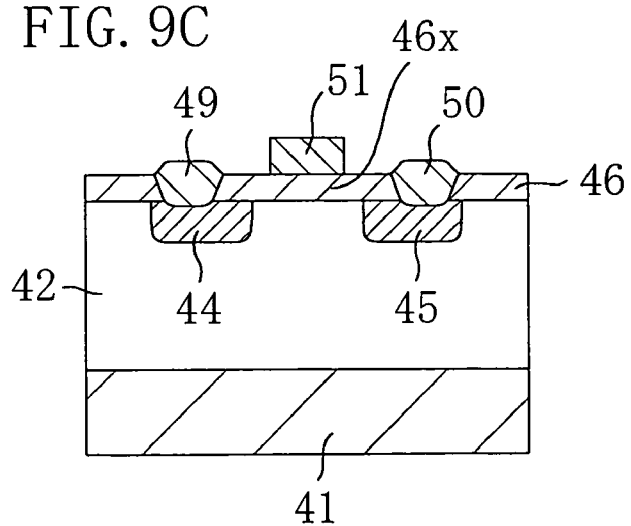

Thereafter, in the step shown in FIG. 9C, a Schottky gate electrode 51 is formed on a region located on the channel layer 46x and between the source and drain electrodes 44 and 46. In forming the Schottky gate electrode 51, a method for lifting off a nickel film, for example, may be utilized. The thickness of the Schottky gate electrode 51 is preferably about 200 nm, for example.

Although the subsequent steps are not shown, a silicon oxide film with a thickens of about 1 μm is deposited as an interlayer dielectric film that covers the source electrode 44, the drain electrode 45, the Schottky gate electrode 51 and the channel layer 46x, and then RIE or the like is performed to form via holes that pass through the interlayer dielectric film and reach the source electrode 44, the drain electrode 45 and the Schottky gate electrode 51. Thereafter, an aluminum film with a thickness of about 2 μm is deposited by vacuum deposition or the like, and the aluminum film is patterned by normal photolithography and/or etching, thus forming electrode pads and/or interconnects.

Also in the present embodiment, since the surface of the channel layer 46x is smoothed, the MESFET with a high carrier mobility and a high current drive capability is obtained as in the second embodiment. In particular, in the MESFET of the present embodiment, since the channel layer 46x has the stacked doped layer structure, the MESFET with a high breakdown voltage and a high current drive capability is obtained.

By using TEM, we evaluated the cross section of the channel layer 46x of the MESFET formed by performing the fabrication process of the present embodiment, and only observed irregularities having a maximum surface roughness Rmax of about 1 nm and an average surface roughness Ra of 1 nm or less at lower and upper surfaces of the channel layer 46x, which means that the surface of the channel layer 46x is favorably smoothed.

The semiconductor device of the present embodiment is the MESFET having no gate insulating film. However, even if the semiconductor device is a lateral-type MISFET provided with: a gate insulating film located on the channel layer 46x; and a gate electrode located on the gate insulating film, the effects similar to those of the first embodiment can be achieved.

The MESFET or lateral-type MISFET according to the present embodiment may each be formed using not only a bulk SiC substrate, but also a SiC substrate that is obtained by epitaxially growing a SiC layer on, for example, a substrate made of various oxides.

Fifth Embodiment

Figure 10:
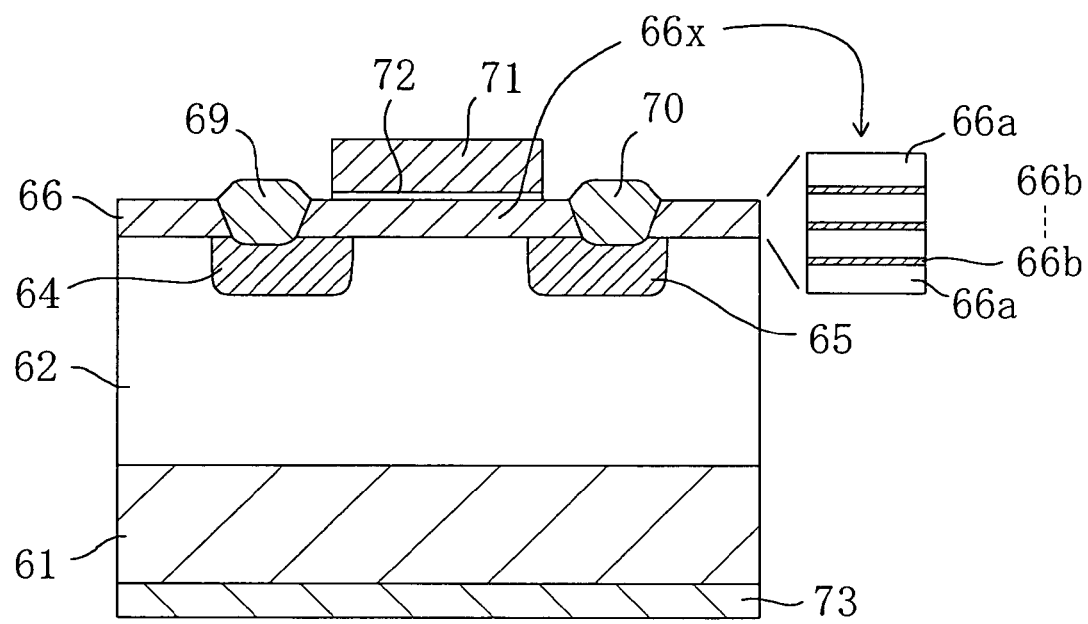
FIG. 10 is a cross-sectional view illustrating the structure of a MESFET that is a lateral-type transistor according to a fifth embodiment of the present invention.

FIG. 10 is a cross-sectional view illustrating the structure of a MISFET that is a lateral-type transistor according to a fifth embodiment of the present invention.

As shown in FIG. 10, the MISFET of the present embodiment includes: a SiC substrate 61 containing a p-type dopant at a low concentration; an undoped high resistance SiC layer 62 epitaxially grown on the SiC substrate 61 and containing a p-type dopant at a concentration of about $1 \times 10^{15} cm^{-3}$ to about $1 \times 10^{16} cm^{-3}$; source and drain regions 64 and 65 formed by doping each of two separate regions within the high resistance SiC layer 62 with an n-type dopant; an epitaxially grown layer 66 including a channel layer 66x epitaxially grown on the high resistance SiC layer 62; a source electrode 69 formed of a Ni alloy film that passes through a portion of the epitaxially grown layer 66, located above the source region 64, to reach the source region 64; a drain electrode 70 formed of a Ni alloy film that passes through a portion of the channel layer 66x, located above the drain region 65, to reach the drain region 65; a gate electrode 71 formed over a region of the channel layer 66x located between the source and drain electrodes 69 and 70; and a gate insulating film 72 interposed between the gate electrode 71 and the channel layer 66x. The gate insulating film 72 has a thickness of about 80 nm, a gate length of 10 μm and a gate width of 500 μm. A base electrode 73 made of Al is provided on the reverse surface of the SiC substrate 61.

The channel layer 66x has a stacked doped layer structure formed by alternately stacking: a first semiconductor layer 66a functioning as a carrier-traveling region; and a second semiconductor layer 66b that is thinner than the first semiconductor layer 66a and contains a high-concentration n-type dopant for enabling supply of carries to the first semiconductor layer 66a. For example, each first semiconductor layer 66a has a dopant concentration of $1 \times 10^{16} cm^{-3}$ or less and a thickness of about 40 nm, and each second semiconductor layer 66b has a dopant concentration of about $1 \times 10^{17} cm^{-3}$ to about $1 \times 10^{18} cm^{-3}$ and a thickness of about 10 nm. For example, the first and second semiconductor layers 66a and 66b are alternately deposited for three cycles with the first semiconductor layer 66a formed as the lowermost layer of the channel layer 66x, and the first semiconductor layer 66a is further formed as the uppermost layer of the channel layer 66x. In this case, if each first semiconductor layer 66a has a thickness of 40 nm and each second semiconductor layer 66b has a thickness of 10 nm, the resulting channel layer 66x has a thickness of 190 nm.

The fabrication method of the present embodiment is not shown and not described since the fabrication method of the present embodiment is basically similar to that of the fourth embodiment, except that the step of forming the gate insulating film 72 is added Since the surface of the channel layer 66x is smoothed the lateral-type MISFET according to the present embodiment can achieve a high current drive capability and a high carrier mobility like the vertical-type MISFET according to the second embodiment. Besides, threshold voltage variations due to the production lot of the MISFETs and the positions thereof within a wafer are reduced.

Figure 13A:
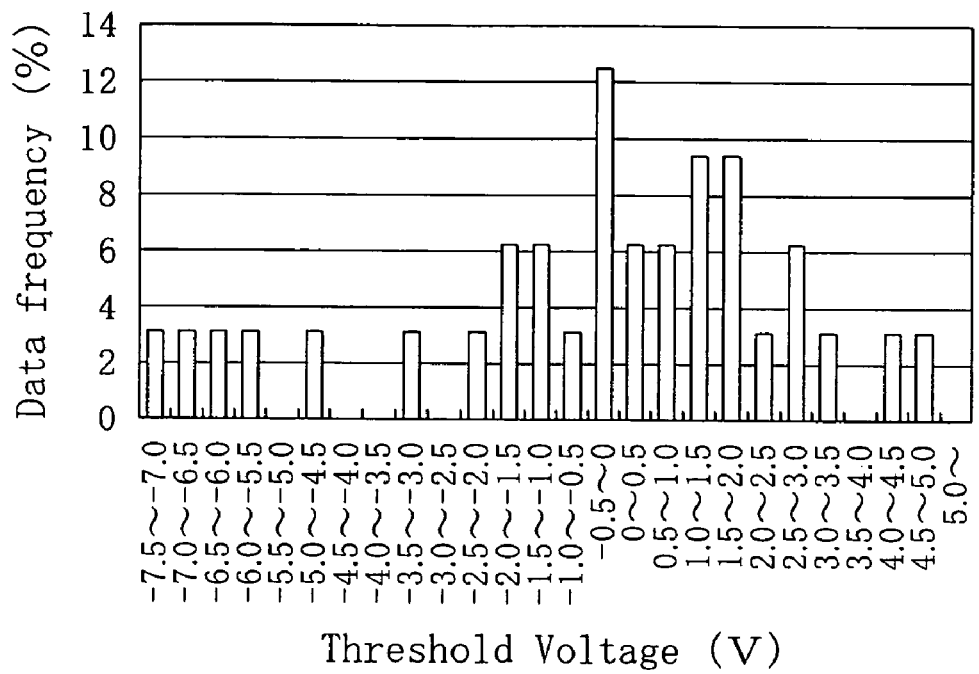
FIGS. 13A and 13B are graphs showing threshold voltage distributions in a lateral-type MISFET according to a reference example and a lateral-type MISFET according to the present embodiment.
Figure 13B:
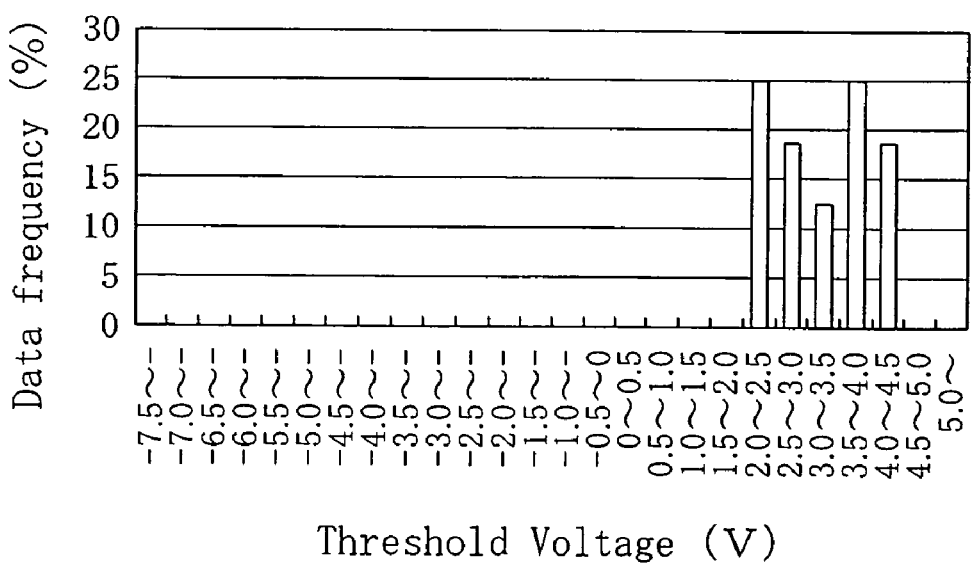

FIGS. 13A and 13B are graphs showing threshold voltage distributions in a lateral-type MISFET according to a reference example and a lateral-type MISFET according to the present embodiment. In the lateral-type MISFET according to the reference example, a channel layer is epitaxially grown, ion implantation for forming source/drain regions is carried out from above the channel layer, a carbon film is further deposited, and then dopant activation annealing is performed. By comparing the data shown in FIG. 13A with that shown in FIG. 13B, it is seen that the threshold voltage of the lateral-type MISFET according to the reference example is varied in the range of −7.5 V to 5.0 V, whereas the threshold voltage of the lateral-type MISFET according to the present embodiment is concentratedly varied in the rage of 2.0 V to 4.5 V, and the present embodiment can achieve the lateral-type MISFET having a small threshold voltage variation. Furthermore, it is also seen that the carrier mobility of the lateral-type MISFET according to the present embodiment is 20 cm$^2$/Vs, whereas that of the lateral-type MISFET according to the present embodiment is 70 cm$^2$/Vs. That is, the carrier mobility of the lateral-type MISFET according to the present embodiment is more significantly improved than that of the lateral-type MISFET according to the present embodiment.

It should be noted that although the data shown in FIG. 13B is about the lateral-type MISFET, the similar data is obtained with regard to a vertical-type MISFET. Therefore, in the vertical-type MISFET, ion implantation for forming a source region is carried out; on the other hand, in the lateral-type MISFET and MESFET, ion implantation for forming source/drain regions is carried out. Thereafter, annealing for dopant activation is performed with a carbon film being deposited, the carbon film is then removed, and annealing for forming a channel layer is performed, thus obtaining the channel layer having a surface roughness smaller than that of an underlying layer for epitaxial growth. As a result, it becomes possible to obtain the vertical-type MISFET, the lateral-type MISFET or MESFET exhibiting a high current drive capability.

Besides, it becomes possible to improve the carrier mobility of the resulting device, and to obtain the MISFET (including the vertical-type MISFET and the lateral-type MISFET) which has a small threshold voltage variation.

The inventive semiconductor device and the fabrication method thereof can be utilized for a MISFET, MESFET or the like that uses a SiC substrate, which is particularly suitable for a power device or a high-frequency device.

What is claimed is:

1. A semiconductor device comprising:
   a first silicon carbide layer provided on a principal surface of a substrate;
   a dopant diffused well region provided in a part of the first silicon carbide layer and including a dopant of a second conductivity type;
   a high-concentration dopant diffused source region provided in a part of the dopant diffused well region and including a dopant of a first conductivity type;
   a second silicon carbide layer formed on at least a part of the high-concentration dopant diffused source region, on the dopant diffused well region, and on the first silicon carbide layer by epitaxial growth; and
   a channel layer provided in a part of the second silicon carbide layer and extended over at least a portion of the high-concentration dopant diffused source region, the dopant diffused well region, and the first silicon carbide layer,
   wherein upper surfaces of the high-concentration dopant diffused source region, the dopant diffused well region, and the first silicon carbide layer are on the same plane,
   the upper surface of the channel layer being smoother than that of the first silicon carbide layer, and
   the dopant of the first conductivity type is different than the dopant of the second conductivity type.

2. The semiconductor device according to claim 1, wherein the semiconductor device further comprises an electrode that passes through the second silicon carbide layer to reach the high-concentration dopant diffused source region.

3. The semiconductor device according to claim 1, wherein an upper surface of the first silicon carbide layer is smoothed by polishing.

4. The semiconductor device according to claim 1, wherein the upper surface of the first silicon carbide layer is subjected to a dopant activation process with the first silicon carbide layer covered with a carbon film.

5. The semiconductor device according to claim 1, wherein in the cross section of the semiconductor device including the channel layer and the high-concentration dopant diffused source region, a lateral size of a region where the channel layer and the high-concentration dopant diffused source region are overlapped is greater than the thickness of the channel layer.

6. The semiconductor device according to claim 1, wherein a surface of the first silicon carbide layer in contact with the channel layer has an average surface roughness of 2 nm or less.

7. The semiconductor device according to claim 1, wherein an upper surface of the channel layer has an average surface roughness of 1 nm or less.

8. The semiconductor device according to claim 1, the channel layer comprises a stacked doped layer structure formed by alternately stacking: at least one first semiconductor layer functioning as a carrier-traveling region; and at least one second semiconductor layer including a high-concentration carrier dopant, thinner than the first semiconductor layer, and capable of supplying carries to the first semiconductor layer.

9. The semiconductor device according to claim 1, functioning as a vertical-type MISFET, wherein the semiconductor device further comprises:
   a gate insulating film provided on the channel layer;
   a gate electrode provided on the gate insulating film; and
   an ohmic electrode provided on a backside of the substrate,
   wherein the high-concentration dopant diffused source region functions as a source region, and
   wherein the substrate functions as a drain region.

10. The semiconductor device according to claim 1, functioning as a lateral-type MISFET, wherein the semiconductor device further comprises:
    a high-concentration dopant diffused drain region provided in another part of the first silicon carbide layer and including a dopant of a first conductivity type;
    a gate insulating film provided on the channel layer; and
    a gate electrode provided on the gate insulating film,
    wherein the high-concentration dopant diffused source region and said the high-concentration dopant diffused drain region function as source/drain regions, and
    wherein the channel layer extends over the high-concentration dopant diffused source region and said high-concentration dopant diffused drain region.

11. The semiconductor device according to claim 9, functions as an accumulation-mode MISFET, wherein the channel layer includes a dopant of the first conductivity type.

12. The semiconductor device according to claim 1, functioning as a MESFET, wherein the semiconductor device further comprises:
    a high-concentration dopant diffused drain region provided in another part of the first silicon carbide layer and including a dopant of a first conductivity type; and
    a gate electrode in Schottky contact with the channel layer,
    wherein the high-concentration dopant diffused source region and said the high-concentration dopant diffused drain region function as source/drain regions, and
    wherein the channel layer extends over the high-concentration dopant diffused source region and said the high-concentration dopant diffused drain region.

13. A semiconductor device according to claim 2, wherein the semiconductor device further comprises a high-concentration dopant diffused contact region that passes through the high-concentration dopant diffused source region to make electrical contact with the dopant diffused well region.

* * * * *